(12) United States Patent
Miller et al.

(10) Patent No.: US 8,378,414 B2
(45) Date of Patent: Feb. 19, 2013

(54) LOW LEAKAGE FINFETS

(75) Inventors: Gayle W. Miller, Colorado Springs, CO (US); Volker Dudek, Brackenheim (DE); Michael Graf, Leutenbach (DE)

(73) Assignee: Atmel Corporation, San Jose, CA (US)

( * ) Notice: Subject to any disclaimer, the term of this patent is extended or adjusted under 35 U.S.C. 154(b) by 37 days.

(21) Appl. No.: 13/174,398

(22) Filed: Jun. 30, 2011

(65) Prior Publication Data

US 2011/0260250 A1 Oct. 27, 2011

Related U.S. Application Data

(62) Division of application No. 11/397,784, filed on Apr. 4, 2006, now abandoned.

(51) Int. Cl.
*H01L 29/76* (2006.01)
(52) U.S. Cl. .. 257/328; 257/352; 257/368; 257/E29.067
(58) Field of Classification Search .................. 257/328, 257/352, 368, E27.029, E29.067
See application file for complete search history.

(56) References Cited

U.S. PATENT DOCUMENTS

| | | | |
|---|---|---|---|
| 5,729,045 | A | 3/1998 | Buynoski |
| 5,970,330 | A | 10/1999 | Buynoski |
| 6,107,661 | A | 8/2000 | Okabe et al. |
| 6,188,104 | B1 | 2/2001 | Choi et al. |
| 6,417,107 | B1 | 7/2002 | Sekimura |
| 6,537,893 | B2 | 3/2003 | Watt |
| 6,630,389 | B2 | 10/2003 | Shibata et al. |
| 6,864,534 | B2 | 3/2005 | Ipposhi et al. |
| 6,870,226 | B2 | 3/2005 | Maeda et al. |
| 7,285,820 | B2 * | 10/2007 | Park et al. ............ 257/316 |
| 7,385,247 | B2 * | 6/2008 | Rhee et al. ............ 257/329 |
| 2003/0173333 | A1 | 9/2003 | Wang et al. |
| 2004/0038464 | A1 * | 2/2004 | Fried et al. ............ 438/151 |
| 2004/0150096 | A1 | 8/2004 | Purushothaman et al. |
| 2005/0142800 | A1 | 6/2005 | Choi |
| 2008/0050865 | A1 * | 2/2008 | Jeong-hwan ............ 438/157 |

OTHER PUBLICATIONS

J.G. Fossum et al.; "Suppression of Corner Effects in Triple-Gate MOSFETs"; IEEE Electron Device Letters, vol. 24, No. 12, Dec. 2003, pp. 745-747.
S.H. Kim et al.; "Bulk Inversion in FinFets and Implied Insights on Effective Gate Width"; IEEE Transactions on Electron Devices, vol. 52, No. 9, Sep. 2005, pp. 1993-1997.
A. Burenkov et al.; "Corner Effect in Double and Triple Gate FinFETs"; Fraunhofer Institute of Integrated Systems and Device Technology, Schottkystrasse 10, 91058 Erlangen, Germany, 4 pages, ESSDERC, 33rd Conf., 2003.
F. Sheikh et al., "The Impact of Device-Width Quantization on Digital Circuit Design Using FinFET Structures", EE 241 Spring 2004, 6 pages.
Website printout: MEMC Electronic Materials, Inc., "<100> Notch Orientation for Increased PMOS Drive Current", http://www.memc.com/t-100-notch.asp, 2005, 2 pages. A. Burenkov et al., "On the Role of Corner Effect in FinFETs", Comparison FinFET versus STI MOSFET outline, Fraunhofer Institute, 11 pages, submitted May 10, 2012.
Ja Hutchby et al., "Extending the Road Beyond CMOS", IEEE Circuits and Devices Magazine, Mar. 2002, pp. 28-41.

* cited by examiner

*Primary Examiner* — Tuan N. Quach
(74) *Attorney, Agent, or Firm* — Fish & Richardson P.C.

(57) ABSTRACT

By aligning the primary flat of a wafer with a (100) plane rather than a (110) plane, devices can be formed with primary currents flowing along the (100) plane. In this case, the device will intersect the (111) plane at approximately 54.7 degrees. This intersect angle significantly reduces stress propagation/relief along the (111) direction and consequently reduces defects as well as leakage and parasitic currents. The leakage current reduction is a direct consequence of the change in the dislocation length required to short the source-drain junction. By using this technique the leakage current is reduced by up to two orders of magnitude for an N-channel CMOS device.

13 Claims, 23 Drawing Sheets

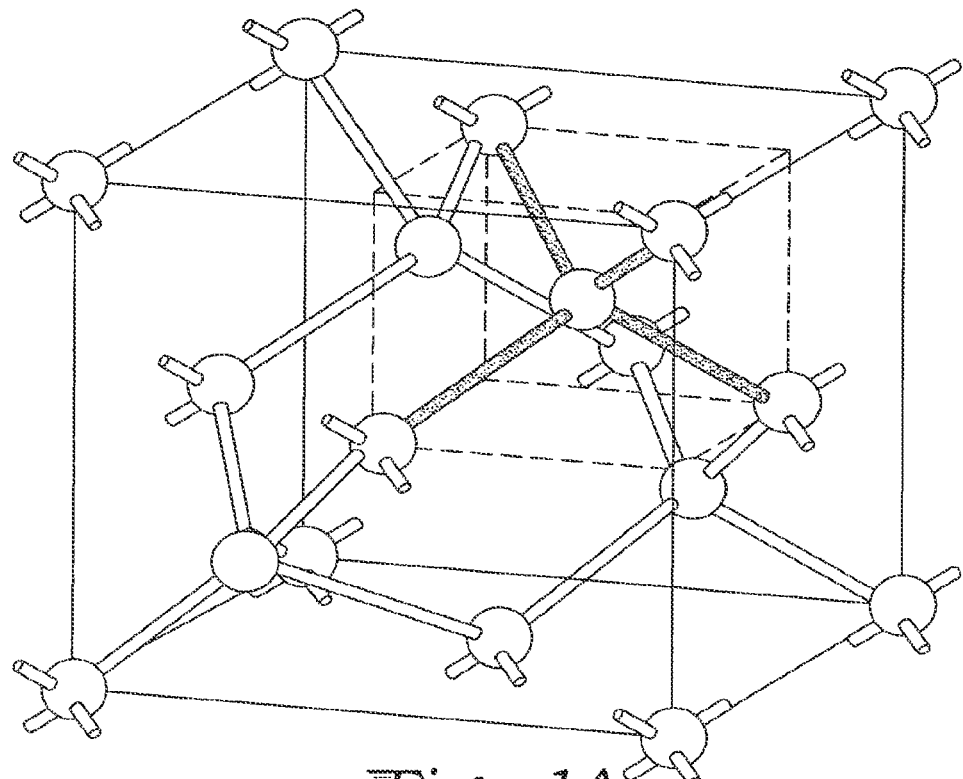
*Fig._1A*
(Prior Art)
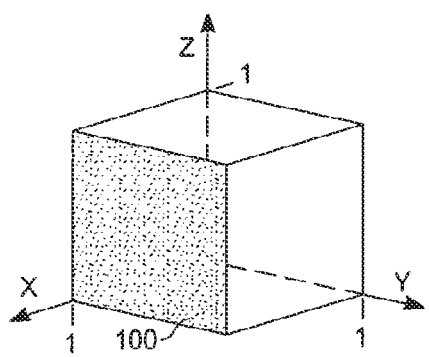
*Fig._1B*
(Prior Art)
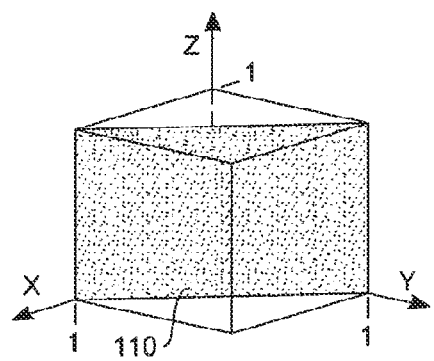
*Fig._1C*
(Prior Art)
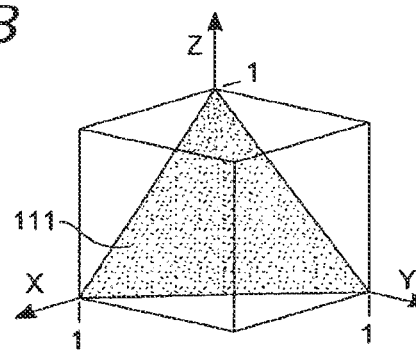
*Fig._1D*
(Prior Art)

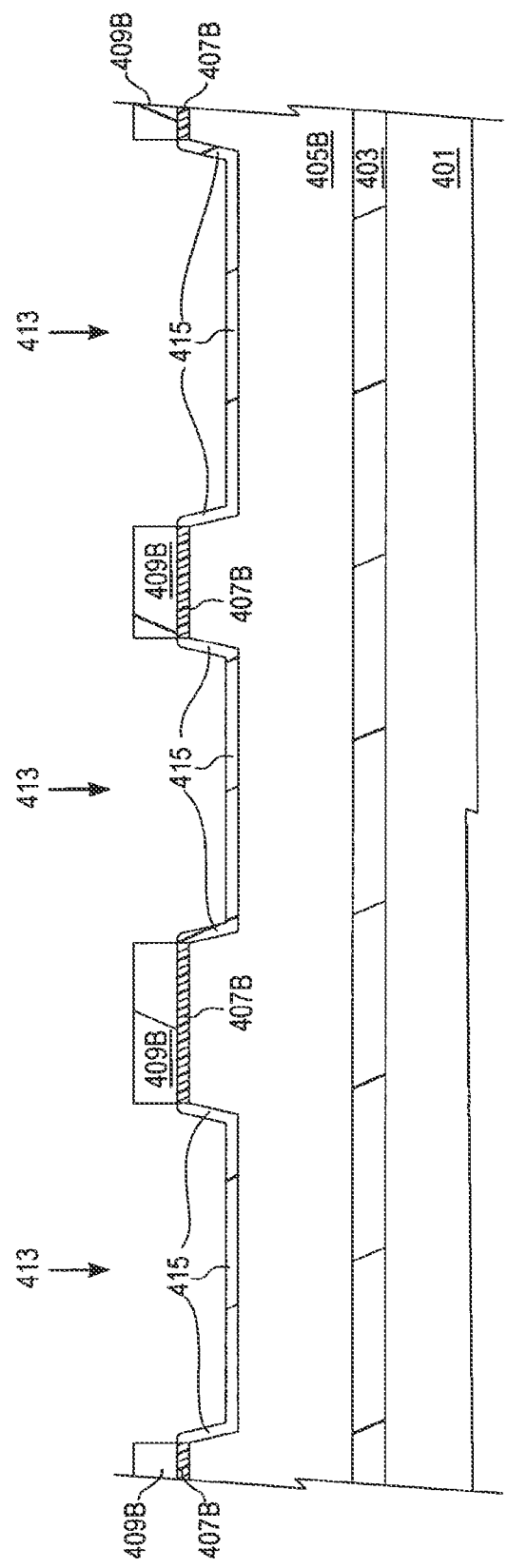
Fig._4C

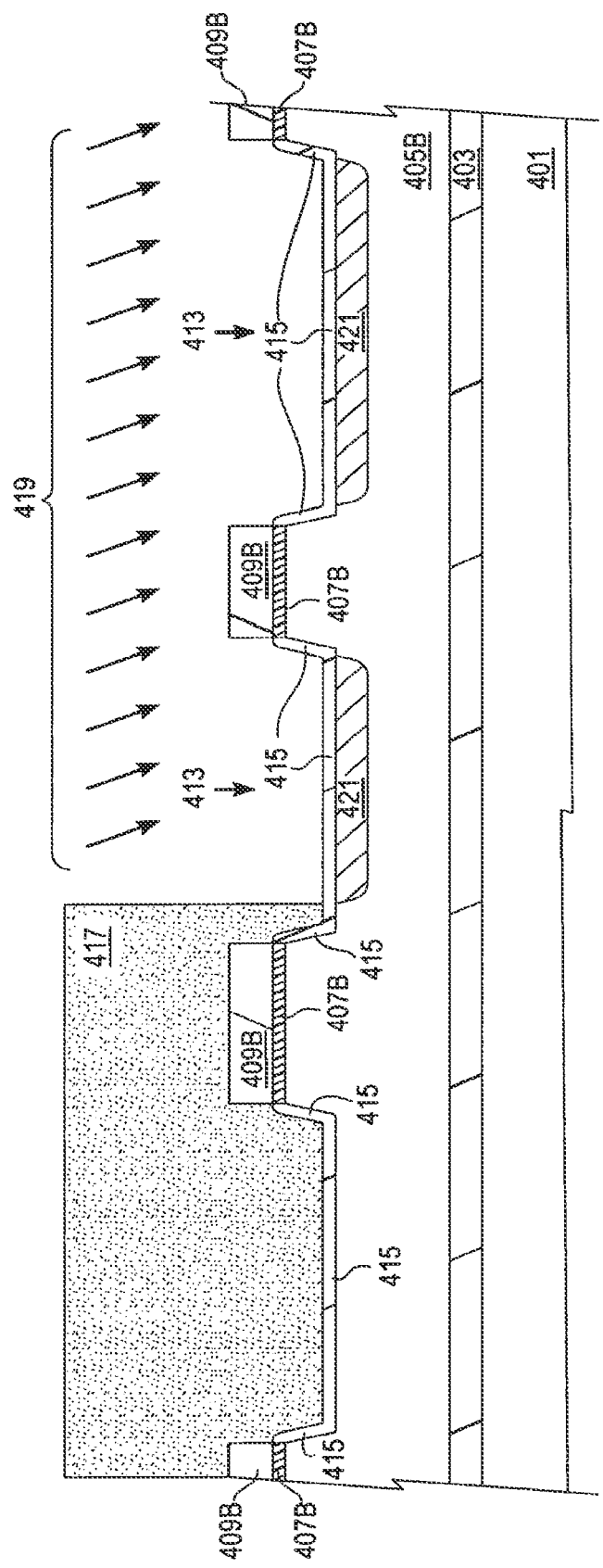
Fig. _ 4D

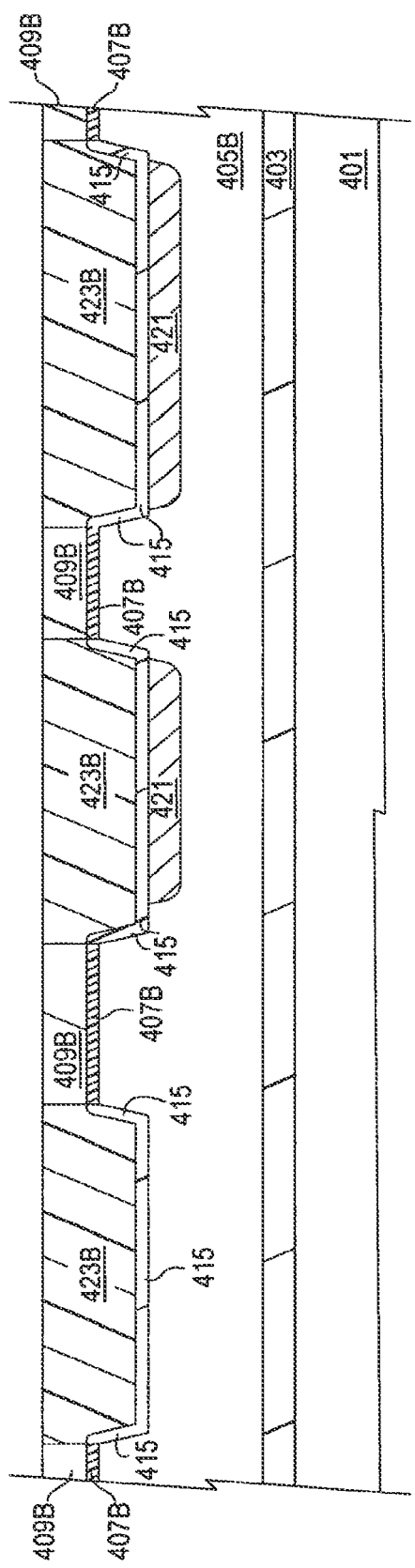
Fig._4F

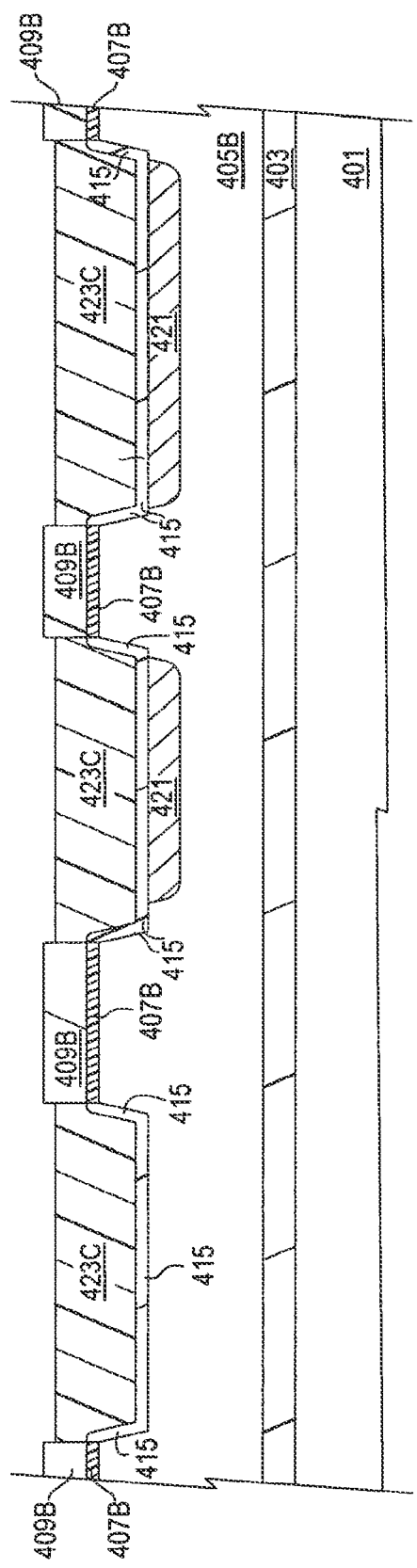
Fig. _ 4G

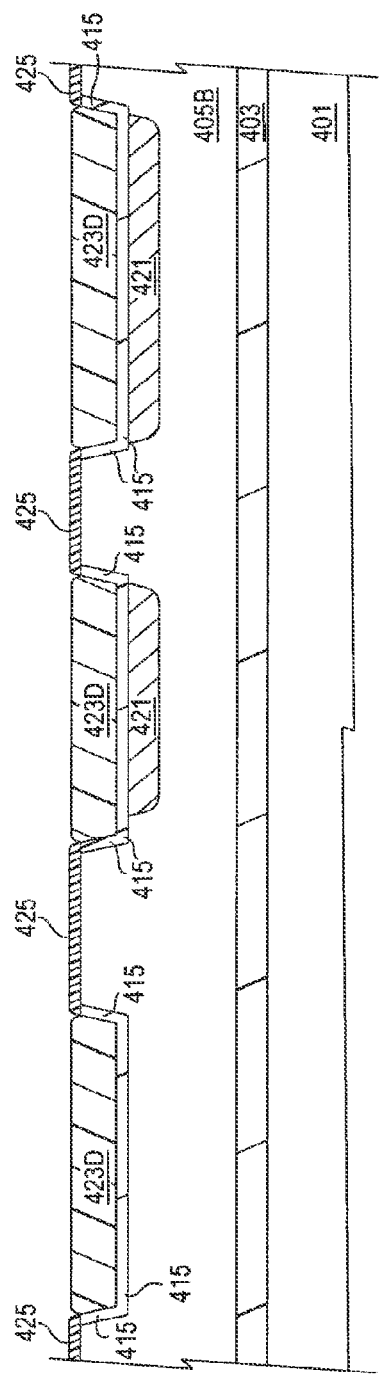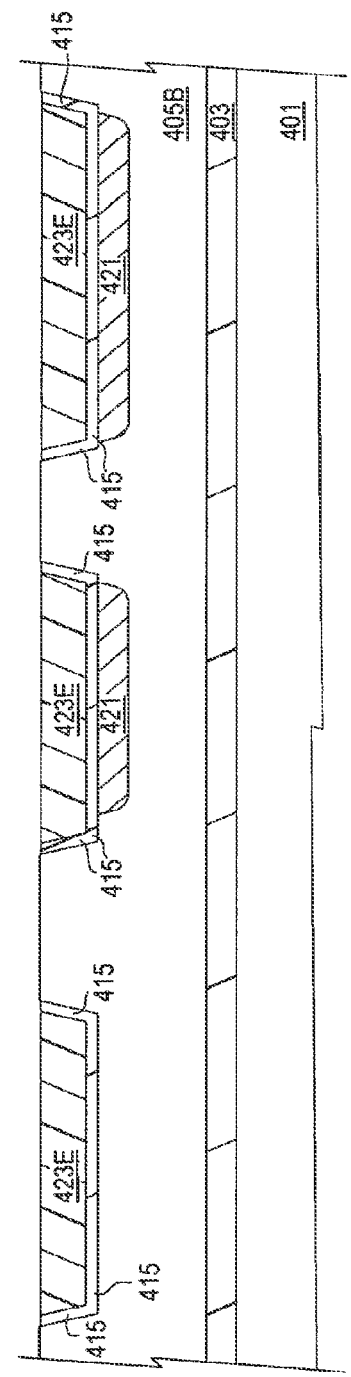

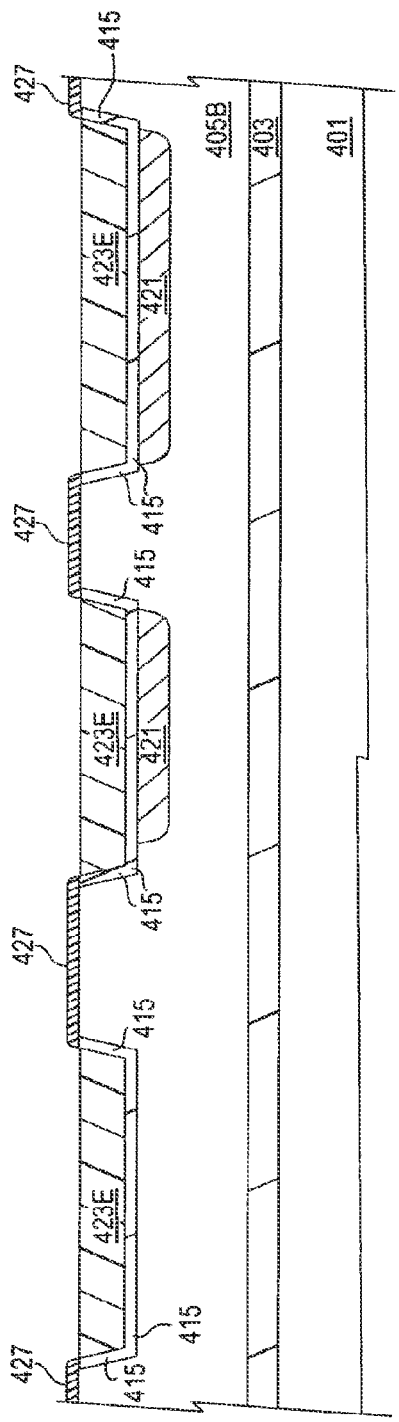
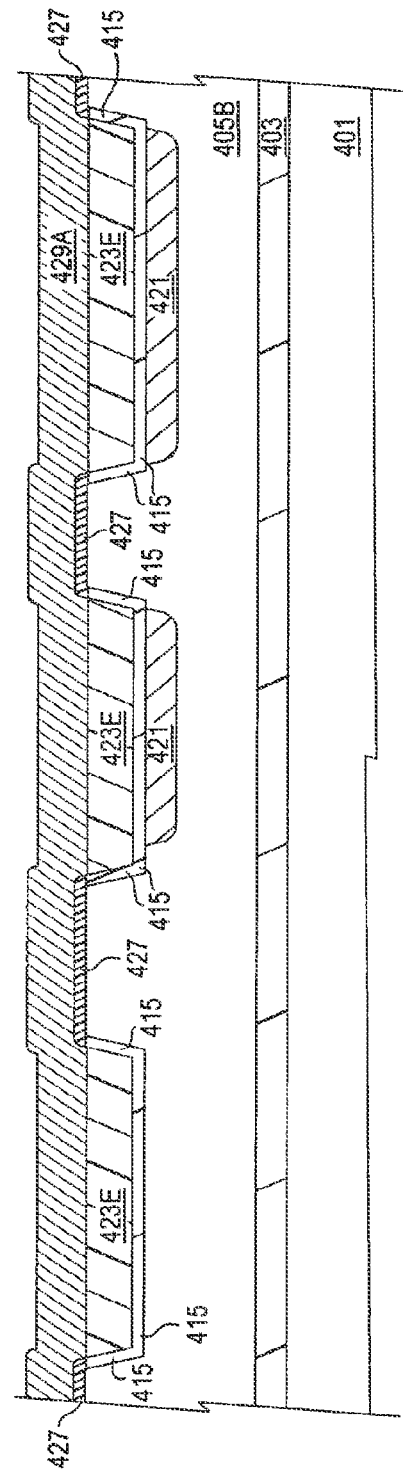
Fig. 4L
Fig. 4M

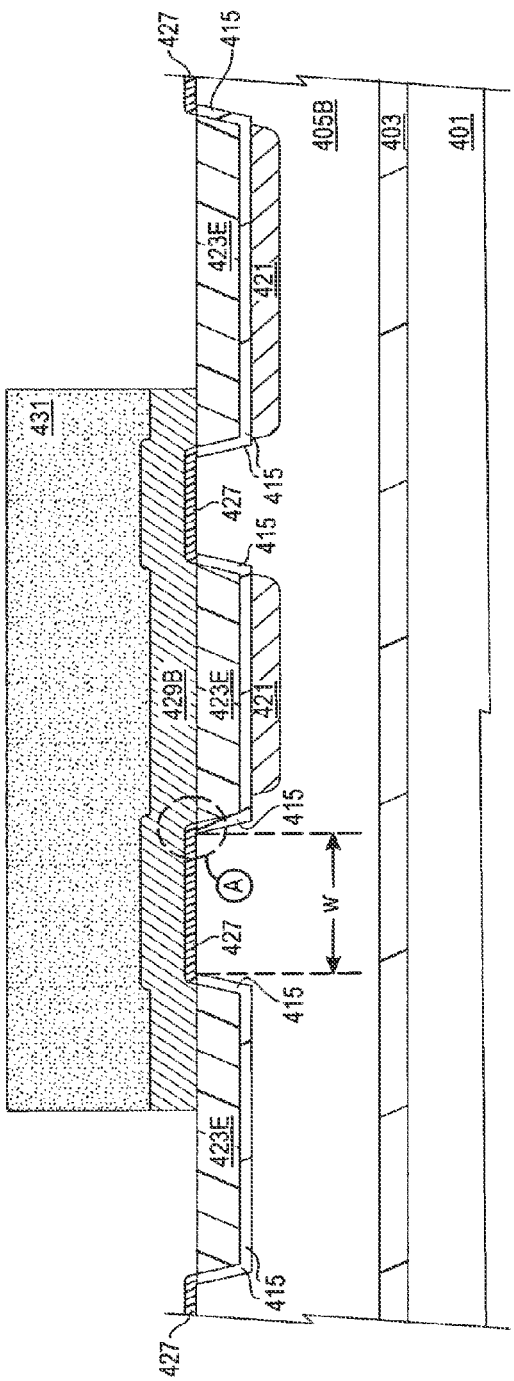
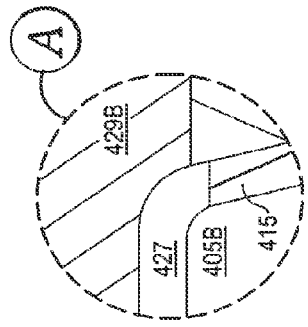
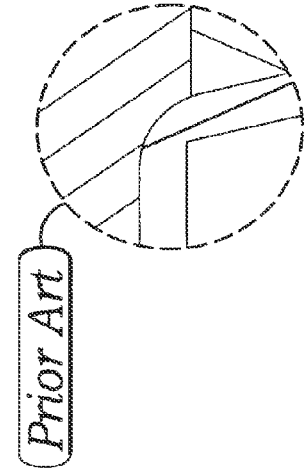
Fig. 4N₁
Fig. 4N₂
Prior Art

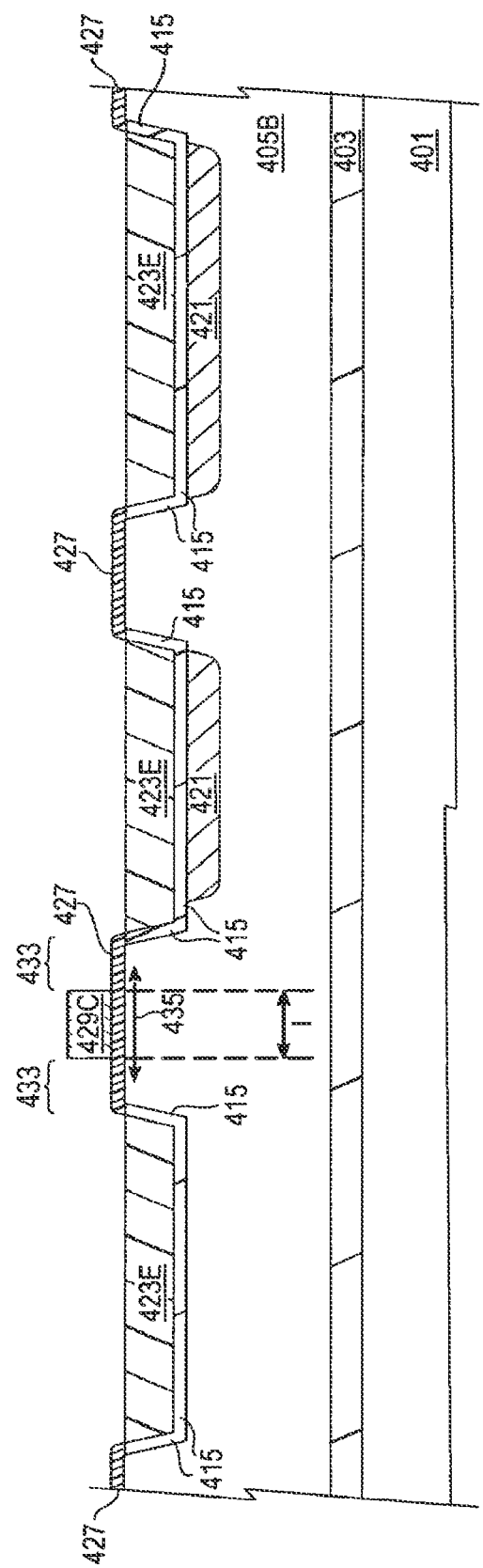
Fig._4O

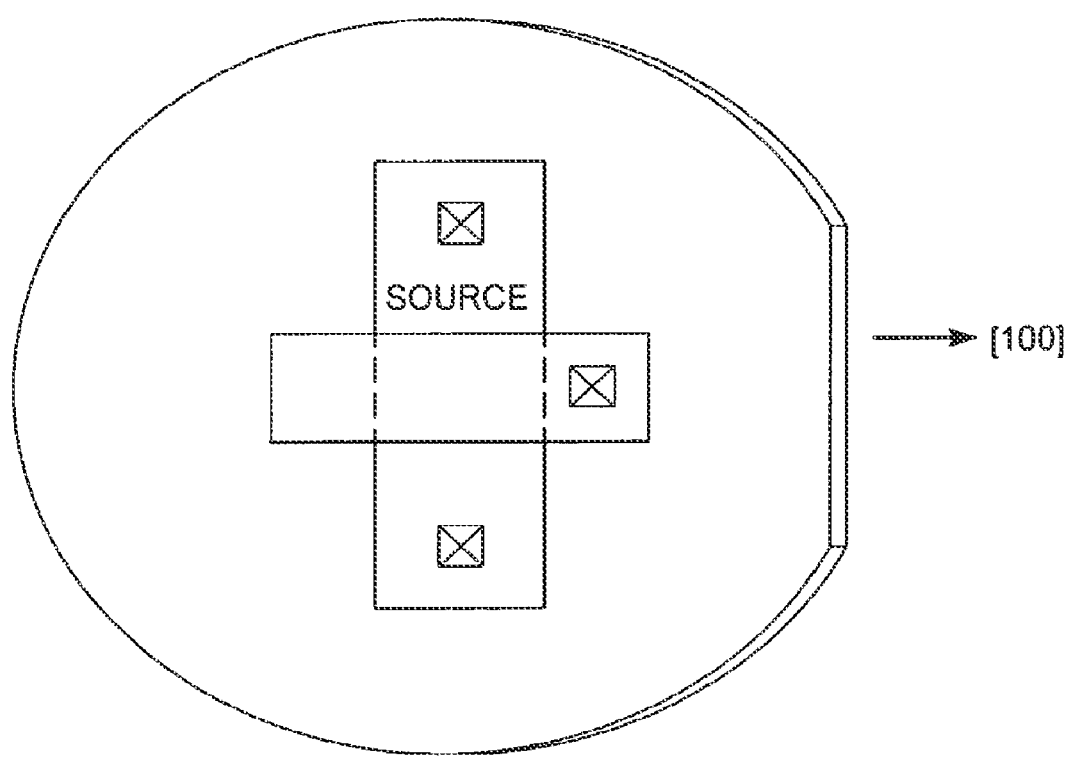
Fig._ 6K

LOW LEAKAGE FINFETS

RELATED APPLICATIONS

This U.S. patent application is a divisional of and claims priority under 35 U.S.C. §120 from U.S. patent application 11/397,784, filed on Apr. 4, 2006, now abandoned. The disclosure of this prior application is considered part of the disclosure of this application and is hereby incorporated herein by reference in its entirety.

FIELD OF THE INVENTION

The present invention relates to the fabrication of integrated circuits and, more specifically, a method for fabricating field effect transistors (FETs) wherein source-drain current flows along a (100) crystal plane.

BACKGROUND

Semiconductor integrated circuit chips are constructed as dice on wafers. A typical wafer material is crystalline silicon. Wafers are cut from single crystal silicon ingots grown from polysilicon by means of, for example, Czochralski method (CZ) crystal growth. CZ wafers are preferred for VLSI applications as they can withstand high thermal stresses and are able to offer an internal gettering mechanism that can remove unwanted impurities from device structures on a wafer surface. This also gives the wafer a uniform internal structure based on silicon's diamond cubic lattice structure. Although the diamond cubic lattice provides strength and rigidity to the wafer, defects in the crystal lattice, for example, slip dislocations, can adversely affect fabricated circuit electrical properties leading to a reduction in the number of good dice per wafer. A schematic representation of the diamond cubic lattice structure of silicon is depicted in FIG. 1A.

The atoms in a crystal lattice structure of a silicon wafer align with each other to form planes traversing the wafer in multiple directions. Three principal planes, and their respective orientations, (100), (110), and (111), are shown in FIGS. 1B-1D. Equivalent planes are designated by braces, for example, {111}, {110}, and {100}, represent equivalents to the (111), (110), and (100) principal planes, respectively. In many applications, orienting the crystal to an s equivalent plane will achieve the same result as aligning it to its principal plane. Many structural properties of silicon depend on its planar orientation. Plane (111) has the highest number of atoms per unit of surface area and is said to be packed very tightly. This high atomic density results in a greater number of available charge carriers, which allows for faster current propagation. Concurrently, the more tightly a crystal plane is packed, the higher the probability that slip dislocations and other defects will occur. These defects can cause parasitic currents as well as charge leaks that can lead to poor performance and device failure.

To help identify crystalline planes, wafers are typically fabricated with a notch or flat relative to a selected crystalline plane. Throughout the integrated circuit (IC) manufacturing industry, automated wafer handling equipment utilize these notches or flats, fabricated in the wafers, to align the wafer, allowing devices on a wafer to be aligned with a specific crystal plane. A development in the art has been the shift to formation of semiconductor devices on a silicon wafer wherein the devices are aligned so that source-drain current in those devices travel along a {110} plane, usually the (110) plane. As indicated above, a {110} plane has a more closely packed atomic structure than a {100} plane, which coincides with a higher charge mobility in devices aligned such that current flows along the (110) plane, as compared to devices aligned such that current flows along the (100) plane. A result of this characteristic of silicon crystals is faster data throughput where device current is aligned along the (110) plane. Several U.S. patents teach the alignment of devices to a (110) plane, for example, U.S. Pat. No. 5,729,045, to Buynosik, entitled "Field Effect Transistor With Higher Mobility," discloses a method of increasing the performance of an FET by aligning channel current with the (110) crystal plane of a (100) wafer. However, the Buynosik device is inappropriate for contemporary high-density device fabrication since any defects present in the crystal lattice can have severe deleterious effects on an electronic device. Buynosik teaches neither how to eliminate or deal with the lattice defects.

In fact, an ongoing trend in microelectronics devices is a reduction in device size. Concurrently, with the scaling down of IC devices, device current paths are smaller and device currents are decreased. One result is that crystal defects and unintentional currents are proportionally larger as IC devices become smaller.

One approach to reducing the problems associated with the defects discussed above is to improve the quality of the wafer itself. One method of improving the wafer is through an epitaxial deposition wherein a thin layer of single crystal silicon material is deposited on the surface of a silicon crystal substrate. These wafers are commonly known as epi wafers. Experimentation has shown that these types of wafers have higher yields than standard wafers.

In FIG. 2, a silicon wafer 201 is shown with a single MOSFET device including a source 205, a drain 207, and a gate 209, wherein a source-drain current channel is aligned to a primary flat 203. The primary flat is typically aligned with the (110) plane and the arrow (vector) indicates a [110] direction, which is normal to the (110) plane. Most commercially available epitaxial wafers are manufactured with the primary flat aligned with the (110) plane. Traditionally, fabrication equipment aligns a wafer using a primary flat (or notch) as a reference. With a primary flat aligned with a (110) plane, devices constructed from these epitaxial wafers have current channels that are aligned along the (110) plane. With larger scale devices, this has not been a problem since any defects formed had little influence on device performance and could be ignored. However, with design rules ever decreasing, any defects present in the crystal lattice can start to have severe deleterious effects on an electronic device.

SUMMARY

By aligning the primary flat (or notch) of, for example, an epi wafer with a (100) plane rather than a (110) plane, devices can be formed with primary currents flowing along the (100) plane. In this case, the device will intersect the (111) plane at approximately 54.7 degrees. This intersect angle significantly reduces stress propagation/relief along the (111) direction and consequently reduces defects as well as leakage and parasitic currents. Leakage current reduction is a direct consequence of the change in the dislocation length required to short the source-drain junction. By using this technique, the leakage current is reduced by up to two orders of magnitude for an n-channel CMOS device.

Defects, such as slip dislocation and gettering points for impurities, are also reduced by employing the techniques presented herein.

One application of an embodiment of the present invention relates to the fabrication of metal-oxide-semiconductor field effect transistors (MOSFETs). MOSFET technology is a dominant electronic device technology in use today. Performance enhancement between generations of devices is generally achieved by reducing an overall size of the device, resulting in an enhancement in device speed. This size reduction is generally referred to as device scaling. As MOSFETs are scaled to channel lengths below about 200 nm, conventional MOSFETs suffer from several problems.

An improvement in MOSFET performance and yield has been observed by incorporating the present invention into the MOSFET fabrication process. By aligning the MOSFET channel so that source-drain channel current flows in the (100) plane, manufacturing related defects and related leakage and parasitic currents are reduced. Another application of various embodiments of the present invention is in the fabrication of a specific type of MOSFET device called a FinFET. A FinFET is a MOSFET with a raised current channel (fin) that utilizes a gate electrode on at least three sides of the channel. Aligning the fin with the (100) plane results in a reduction in capacitance between the gate electrode and FinFET channel and body, and superior electrical isolation between the gate electrode and FinFET channel and body. A further benefit of this fabrication method utilizing a (100) channel direction is that the corners of the gate electrode are inherently rounded, reducing local electric fields and consequently increasing the breakdown voltage and improving uniformity of an electric field in a gate dielectric. Additionally, the (100) channel direction fabrication method described herein reduces stress in silicon "corners." This benefit is especially pronounced during high temperature processing (e.g., during growth of a thermal silicon dioxide gate dielectric). One result of the reduction in stress is that, for example, less boron p-type doping atoms diffuse out of corner regions into any adjacent existing oxide or growing oxide. There is thus less segregation of the s boron into the silicon dioxide. Silicon corner regions maintain a higher doping concentration and, hence, a higher MOS threshold voltage for formation of a parasitic channel in the finished device. Reduction or elimination in the formation of the parasitic channel at low MOS gate voltages produces a substantial reduction in leakage current of the device.

Concepts and techniques discussed herein may be added to various electronic devices as a mechanism by which leakage current is reduced. A skilled artisan will recognize that the present invention may be incorporated into other embodiments where parasitic device current, defects, and leakage current reduction is desired.

BRIEF DESCRIPTION OF THE DRAWINGS

FIG. 1A shows a schematic of a unit cell for a diamond cubic lattice crystal as known in the prior art.

FIGS. 1B-1D show various crystal plane orientations as known in the prior art.

FIGS. 6A-6K show an exemplary FinFET device fabricated using various process steps of various embodiments of the present invention.

DETAILED DESCRIPTION

Figure 2:
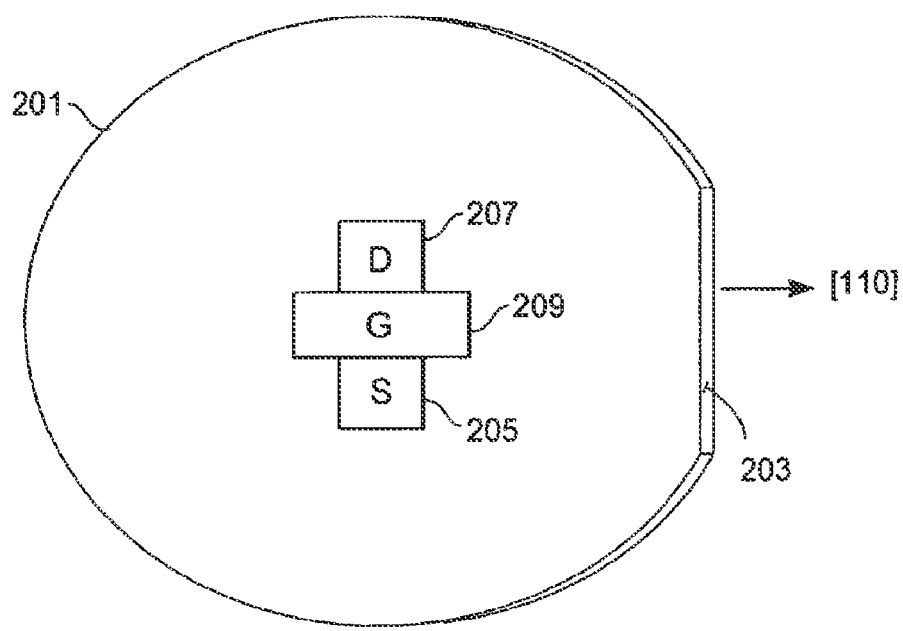
FIG. 2 shows prior art alignment of a primary flat and device orientation on a commercially available epitaxial wafer.
Figure 3:
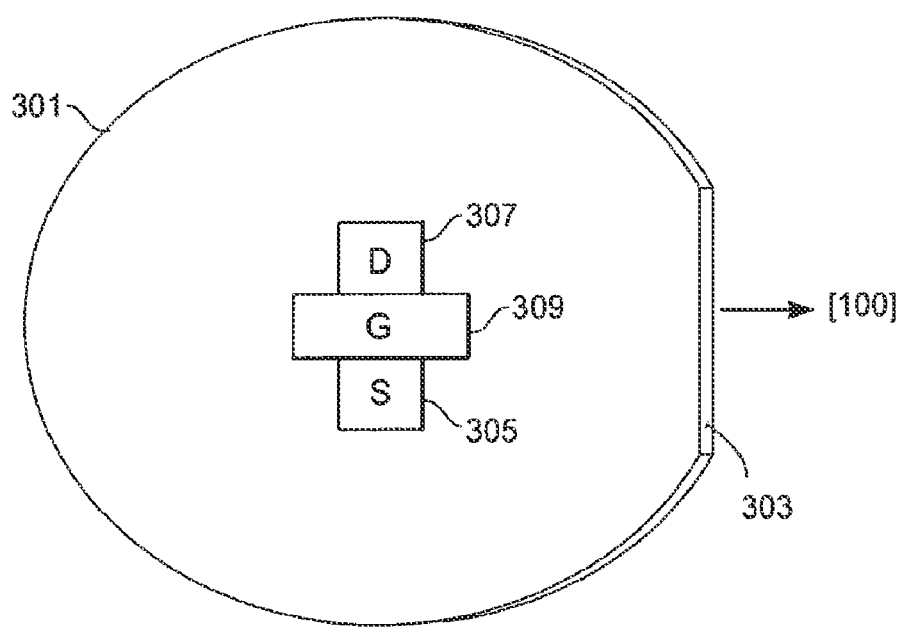
FIG. 3 shows the alignment of a primary flat and device orientation on a wafer with a (100) primary flat orientation.

As device dimensions continue to shrink and thermal cycling continues to increase due to an increase in fabrication steps, defects (e.g., crystalline, contamination, etc.) have a more significant impact on device yield and performance. By aligning the primary flat (or notch) of, for example, an epi wafer with the (100) plane rather than the (110) plane, devices can be formed with traditional fabrication equipment wherein primary currents flow along the (100) plane rather than the (110) plane. In FIG. 3, an epi wafer 301, is shown with a single MOSFET device, including a source 305, a drain 307, and a gate 309 wherein a source-drain current channel is aligned to a primary flat 303. The primary flat 303 is aligned with the (100) plane. Fabricating devices with a primary current path aligned with the (100) plane reduces defects in and parallel to primary current paths and consequently reduces leakage and parasitic currents, as well as increases device yields.

An exemplary embodiment utilizing the present invention is an n-channel MOSFET device with source-drain current that flows along the (100) plane. While the (100) plane is referred to throughout, a skilled artisan will recognize that many equivalent planes will result in a similar advantageous intersect angle with {110}, and {111} planes. As MOSFET fabrication technology is well known in the art, the description that follows with reference to FIGS. 4A-4O and FIGS. 5A-5I is accordingly brief.

Figure 4A:
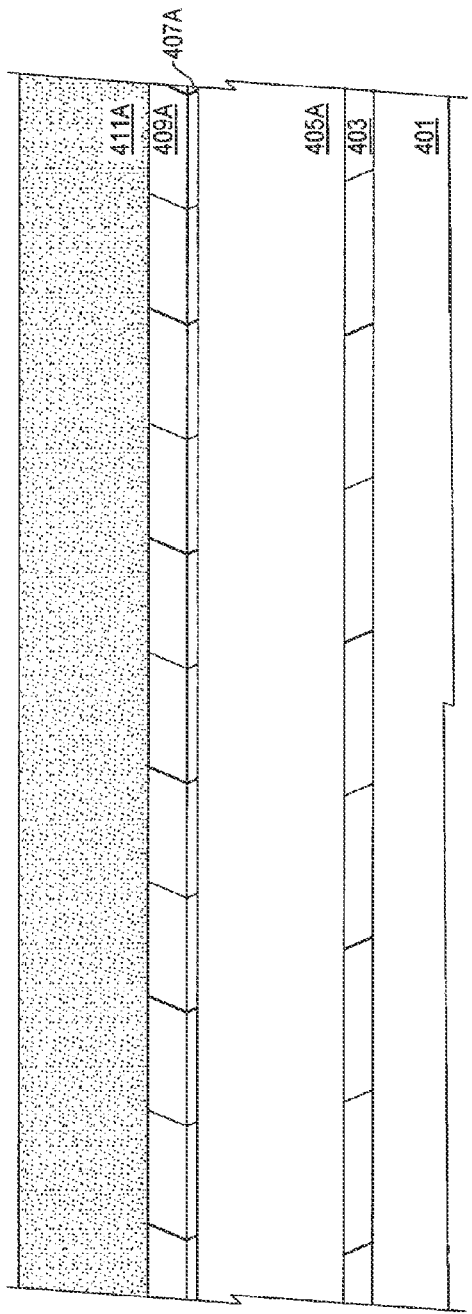
FIGS. 4A-4O show exemplary process steps for one embodiment of the present invention.

With reference to FIG. 4A, a substrate 401 has a dielectric layer 403 formed thereon. An active layer 405A is formed over the dielectric layer 403. In one specific exemplary embodiment, a combination of the s substrate 401, the dielectric layer 403, and the active layer 405A is a silicon-on-insulator (SOI) wafer. In this embodiment, the dielectric layer 403 is a buried oxide layer having a nominal thickness of 500 nm with a practical range of thicknesses being about 15 nm to 1 µm. A thickness of the SOI active layer is nominally 2 µm with a practical range of thicknesses being about 0.3 µ to 25 µm.

In another specific exemplary embodiment, the substrate 401 could be virtually any material capable of withstanding process temperatures and common chemicals encountered during semiconductor fabrication processes. Such materials would include quartz reticles or glass or plastic substrates (i.e., backplanes) used for flat panel displays. In this exemplary embodiment, the dielectric layer 403 may not be required. The active layer 405A could be a deposited polysilicon layer that is deposited and then annealed (e.g., by rapid thermal annealing (RTA) or excimer laser annealing (ELA)) to regain a monocrystalline form.

In another specific exemplary embodiment, the active layer 405A could be a thinned wafer bonded to a suitable substrate. In this embodiment, the bonded wafer is a doped p-type wafer with an epitaxial silicon layer formed thereon, although one skilled in the art will recognize that an n-type doped semiconductor wafer may be used to fabricate a p-type integrated circuit. Alternatively, a group III-V or II-VI bonded semiconductor substrate or an oxygen-implanted silicon (SIMOX) substrate may be used.

Overlying the active layer 405A is a first dielectric layer 407A, a second dielectric layer 409A, and a first photoresist layer 411A. In a specific exemplary embodiment, the two dielectric layers 407A, 409A are a pad oxide with a 20 nm nominal thickness (having a practical range of about 16 nm to 50 nm) and a 120 nm nitride layer (having a practical range of about 100 nm to 200 nm), respectively.

Figure 4B:
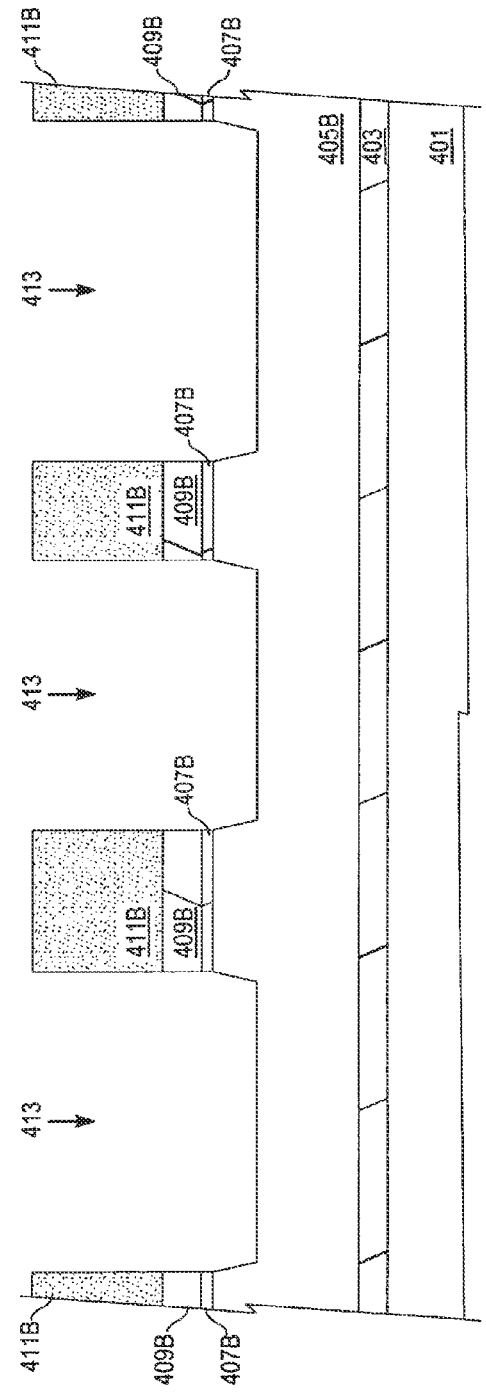

In FIG. 4B, the first photoresist layer 411A is patterned to produce an etched first photoresist layer 411B. The etched first photoresist layer 411B serves as a mask to etch exposed areas of the underlying active layer 405A. If the active layer 405A is comprised of silicon, silicon may be wet-etched, for example, with is potassium hydroxide (KOH) or tetra-methyl ammonium hydroxide (TMAH). Dry-etch techniques, such as a reactive ion etch (RIE) with a fluorine rich plasma (e.g., SFO are also known in the art for etching silicon. Once etched, an etched active layer 405B is produced having a plurality of etched trenches 413. The plurality of trenches 413 may be, for example, approximately 500 nm in depth but a useful range may span from 150 nm to 800 nm in depth.

The etched first photoresist layer 411B is then removed (FIG. 4C) and a liner dielectric layer 415 is formed over exposed areas of the etched active layer 405B (i.e., sidewalls and bottoms of the plurality of etched trenches 413). The liner dielectric layer 415 may be, for example, a thermal oxide grown to approximately 30 nm in thickness. The liner dielectric layer 415 may also be deposited by techniques known in the art (e.g., by chemical vapor deposition (CVD) or atomic layer deposition (ALD)).

In FIG. 4D, a second patterned and etched photoresist layer 417 serves as a mask for an ion implant 419 step. The ion implant 419 step produces a plurality of doped regions 421. As one of skill in the art recognizes, the ion implant 419 step may readily be substituted with a dopant diffusion step.

Figure 4E:
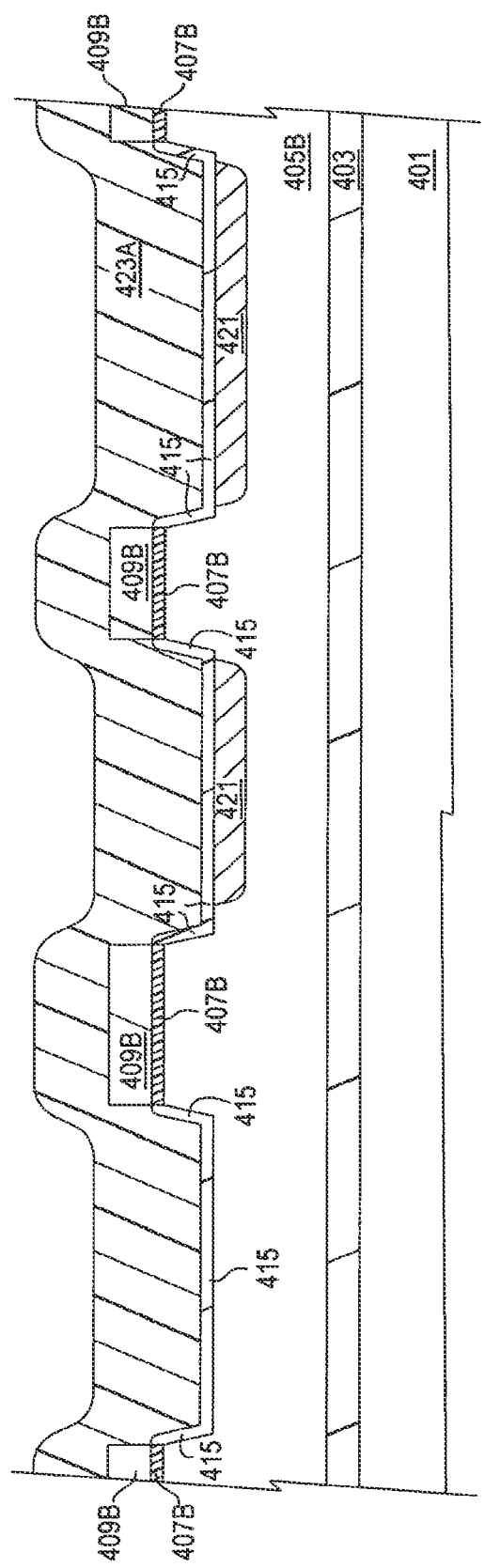

A shallow trench isolation (STI) blanket dielectric fill layer 423A is formed (e.g., oxide formed by CVD or high density plasma (HDP) assisted deposition) so as to cover the etched second dielectric layer 409B (FIG. 4E). A precise thickness of additional coverage is not critical but typically ranges from 50 nm to 300 nm over the etched second dielectric layer 409B. The dielectric fill layer 423A is then planarized (FIG. 4F) to be roughly coplanar with an uppermost portion of the etched second dielectric layer 409B. The planarization step may be accomplished by a chemical-mechanical planarization (CMP) step using an appropriate abrasive slurry. Based on film thicknesses given various specific exemplary embodiments, supra, a planarized STI dielectric fill 423B may be approximately 700 nm in thickness. Any remaining portion of the planarized STI dielectric fill 423B overlying the etched second dielectric layer 409B may be removed with a selective etchant, leaving an etched planarized STI dielectric fill 423C (FIG. 4G).

For example, if the planarized STI dielectric fill 423B is comprised of oxide and the etched second dielectric layer 409B is nitride, a chemical etchant such as hydrofluoric acid (commonly contained in a standard buffered oxide etch (BOE)), or orthophosphoric acid, or alternatively a selective dry etch technique (e.g., reactive-ion-etching (RIE)) will effectively remove the oxide while having little effect on the nitride.

Figure 4H:
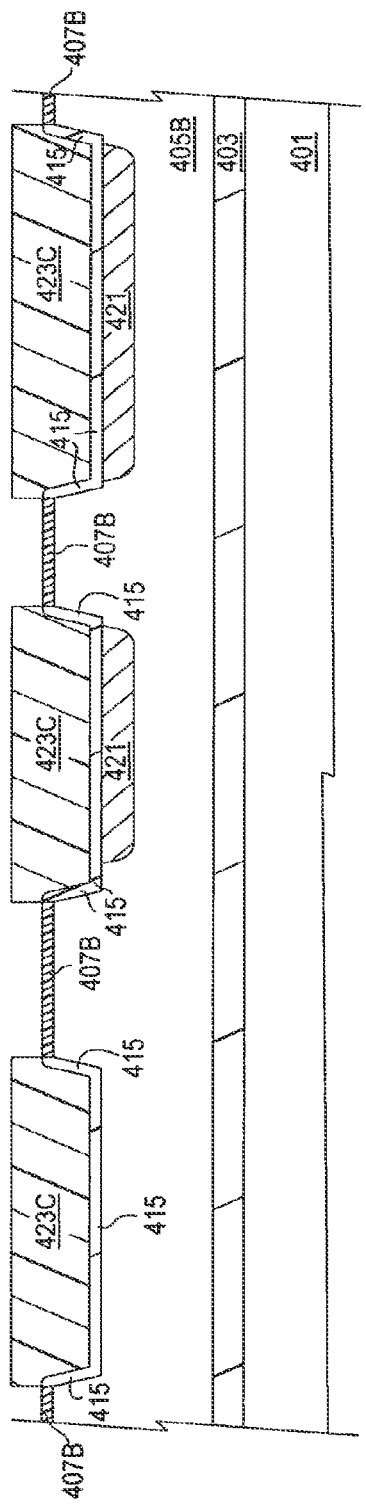
Figure 4I:
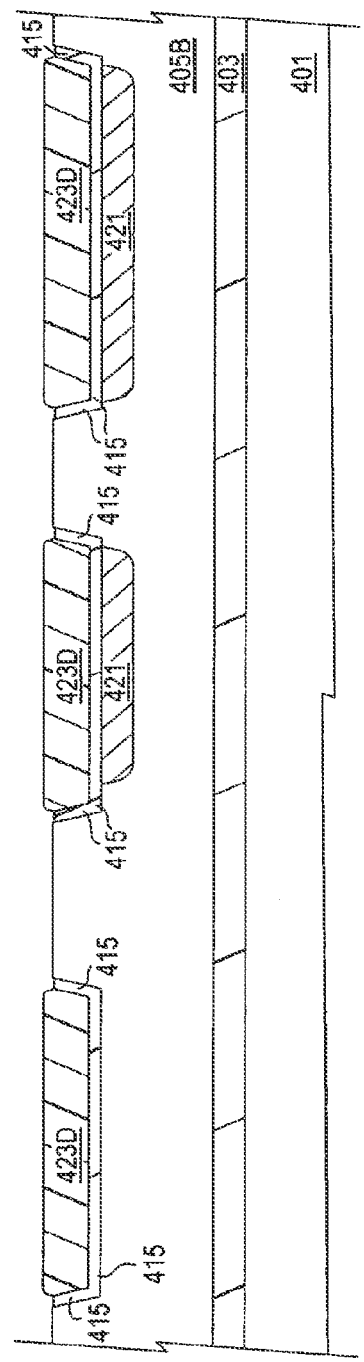

The etched second dielectric layer 409B is then removed (FIG. 4H) followed by removal of the etched first dielectric layer 407B (FIG. 4I). Assuming the etched first dielectric layer 407B and the etched planarized STI dielectric fill 423C are fabricated of materials having similar etch characteristics, removing the first dielectric layer 407B also produces a secondarily-etched planarized STI dielectric fill 423D.

With reference to FIG. 4J, a thin (e.g., to approximately 20 nm) sacrificial dielectric layer 425 is either grown (e.g., if the material chosen for the sacrificial layer is silicon dioxide) or deposited on exposed areas of the etched active layer. The sacrificial dielectric layer 425 serves at least two purposes: (1) to remove contaminants, thereby cleaning exposed active regions; and (2) to act as a screening layer for subsequent dopant diffusions or implants (not shown). After the sacrificial dielectric layer 425 is formed, various device specific dopant regions may be added to the etched active layer 405B with additional photoresist masking steps added as required. For example, a doped channel region for an MOS device could be added at this point in the process flow. Such techniques are device dependent and are known to one of skill in the art.

The sacrificial dielectric layer 425 is then stripped (FIG. 4K). The sacrificial dielectric layer 425 may be stripped by various wet etch or dry etch techniques as described herein with reference to other similar film layers. If the sacrificial dielectric layer 425 and the STI dielectric fill 423D are formed from a similar material (e.g., both are comprised of oxide), then stripping the sacrificial dielectric layer 425 slightly thins the STI dielectric fill 423D as well, leaving a final STI dielectric 423E as indicated in FIG. 4K.

In FIG. 4L, a gate dielectric 427 is formed (e.g., by thermal oxidation or deposition) over now—cleaned and exposed areas of the etched active layer 405B. In a specific exemplary embodiment, the gate dielectric 427 is approximately 80 Å in thickness, although gate thicknesses from 20 Å-300 Å are known in the art.

A semiconductor gate layer 429A (e.g., polysilicon) is deposited (FIG. 4M). In a specific exemplary embodiment, the semiconductor gate layer is approximately 350 nm thick but may range in thickness from 150 nm to 600 nm. Functionally, the semiconductor gate layer 429A will serve various purposes, depending upon a type of device being fabricated. For example, in a Flash memory device, the semiconductor gate layer 429A could serve as a floating gate. In an MOS transistor, the semiconductor gate layer 429A could serve as a control gate.

With reference to FIG. $4N_1$, a third patterned and etched photoresist layer 431 is formed, allowing etching and formation of an etched gate layer 429B. A physical width, "w," of a final transistor fabricated from such a structure is indicated in FIG. $4N_1$. In this arrangement, current flow in a final transistor form would be normal to the page view.

A magnified area "A" is shown in more detail in FIG. $4N_2$. Where the etched active layer 405B has an orientation on, for example a wafer where the primary flat (or notch) is in a (100) plane (also referred to as a "C-Flat wafer, see FIG. 3), upper corners (i.e., proximate to STI top corners) of the etched active layer 405B are necessarily rounded during fabrication. This rounding produces a much more uniform electric field than the sharp corner produced by the prior art. When the electric field is more uniform, leakage current is suppressed by as much as two orders of magnitude between a MOSFET source and drain region. Consequently, leakage of charge into or through the gate dielectric 427 is diminished.

In FIG. 4O, a final gate 429C overlays a channel region of a MOS transistor (only a single gate is shown for clarity; a skilled artisan will recognize that gates may be located over each of the active areas overlaying the gate dielectric areas 427). The gate 429C is surrounded on either side by source and drain dopant regions. (Note: actual doped regions are not shown but merely indicated by areas 433 where such doped region will occur after subsequent processing. Such subsequent process steps are well-known to a skilled artisan.)

In another exemplary embodiment of the present invention and with reference to FIGS. 5A through 5I, additional and alternative fabrication techniques are depicted. Similar feature types defined in FIGS. 5A through 5I share similar range thicknesses as discussed with reference to FIGS. 4A through 4O, supra. A skilled artisan will also recognize that process steps may be intermixed between fabrication steps outlined between the various sets of figures.

Figure 5A:
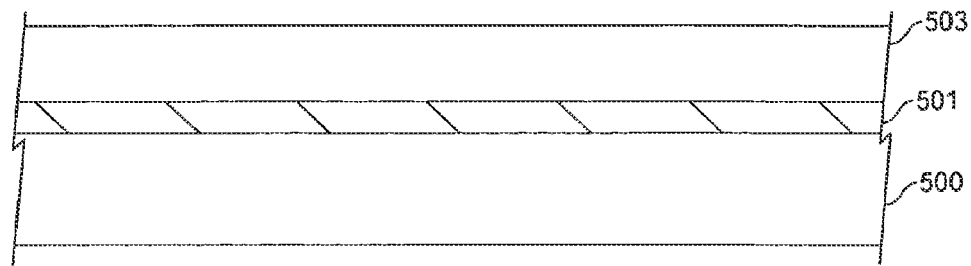
FIGS. 5A-5I show exemplary process steps for another embodiment of the present invention.

In FIG. 5A, a substrate 500 has a dielectric layer 501 formed thereon. In a specific exemplary embodiment, the substrate 500 is a doped p-type wafer with an epitaxial silicon layer formed thereon, although one skilled in the art will recognize that an n-type doped semiconductor wafer may be used to fabricate a p-type integrated circuit. Alternatively, any of the substrate variations described with reference to FIG. 4A, supra, may be used. The epitaxial silicon layer is doped with a lower concentration of a dopant of the same type as the substrate 500. A polysilicon layer 503, is then formed by, for example, chemical vapor deposition (CVD). In a specific exemplary embodiment, the dielectric layer 501 is silicon dioxide, formed by, for example, thermal oxidation.

Figure 5B:
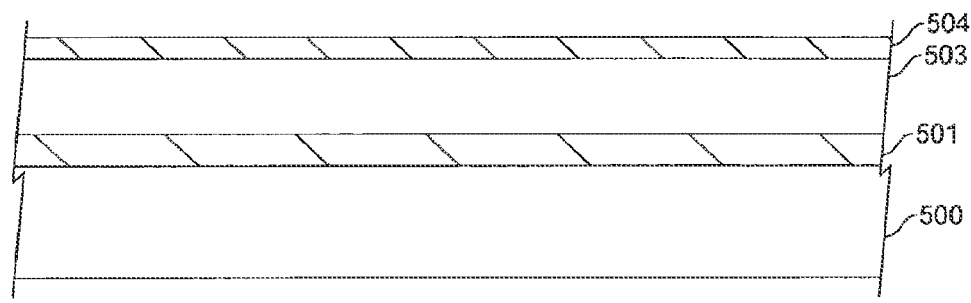

In FIG. 5B, a second dielectric layer 504 is formed over the polysilicon layer 503. In a specific to exemplary embodiment, the second dielectric layer 504 is silicon dioxide and is formed by, for example, CVD.

Figure 5C:
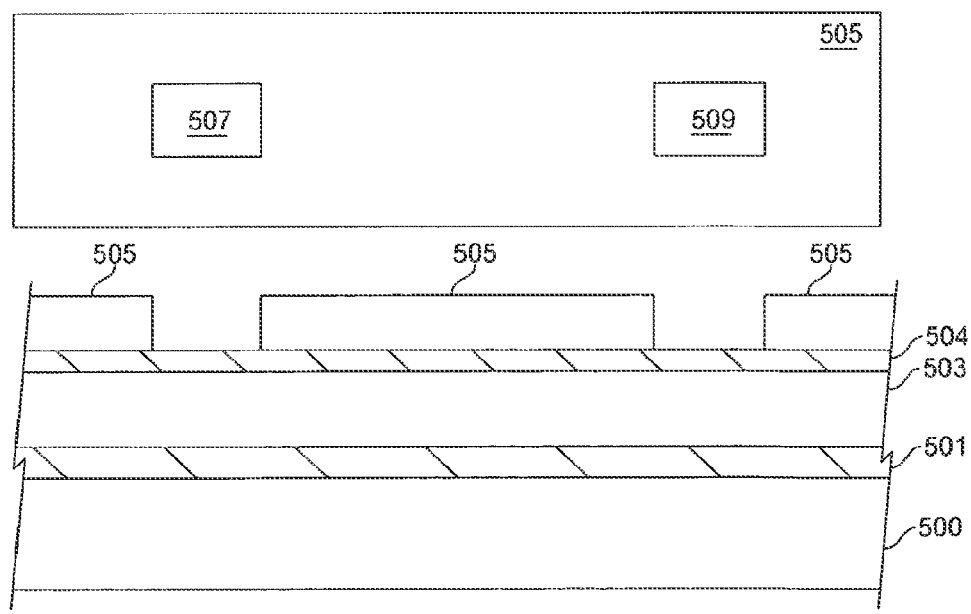

With reference to FIG. 5C, a photoresist mask 505, with patterned apertures exposing a source region aperture 507, and a drain region aperture 509 in the second dielectric layer 504 is formed over the polysilicon layer 503. Both a plan view and cross section are shown.

Figure 5D:
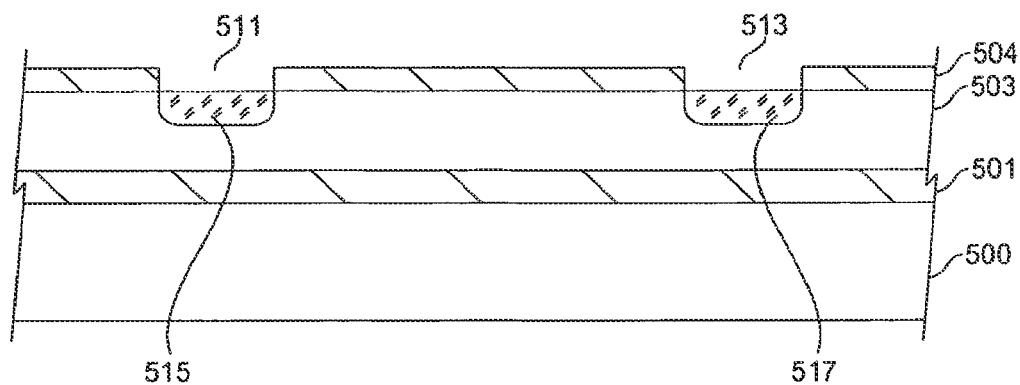

With reference to FIG. 5D, the second dielectric layer 504 has been etched to reveal a source window 511, and a drain window 513; the source window 511 and drain window 513 being aligned along a (100) plane so as to result in current flow along the (100) plane. The photoresist mask 505 has been removed. In a specific exemplary embodiment, the second dielectric layer 504 is etched using hydrofluoric acid, which attacks silicon dioxide rapidly with respect to the photoresist layer 504 and the polysilicon layer 503. In a subsequent step, the source and drain windows 511, 513, are further doped with an n-type dopant, for example, phosphorous, creating a source region 515, and a drain region 517. In a specific exemplary embodiment, the doping is achieved by ion-implantation, although alternative means of doping, such as diffusion, can be used. As is known to a skilled artisan, concentration levels will vary dependent on device type. The second dielectric layer 504 is used to mask the area which is doped.

Figure 5E:
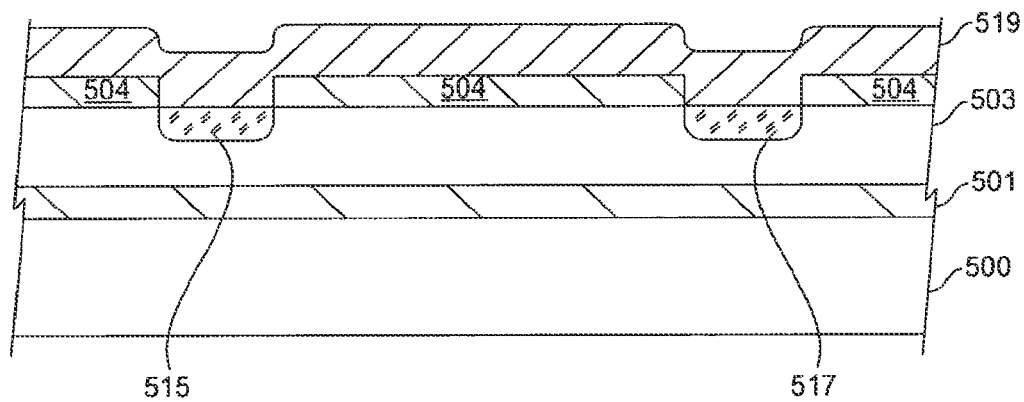

With reference to FIG. 5E, a third dielectric layer 519, is formed over the second dielectric layer 504 by, for example, physical vapor deposition (PVD). While some of the dopant will diffuse into the epitaxial semiconductor layer 503 and the third dielectric layer 519, the concentration of dopant will remain much higher in the implanted region with respect to the epitaxial to semiconductor layer 503.

Figure 5F:
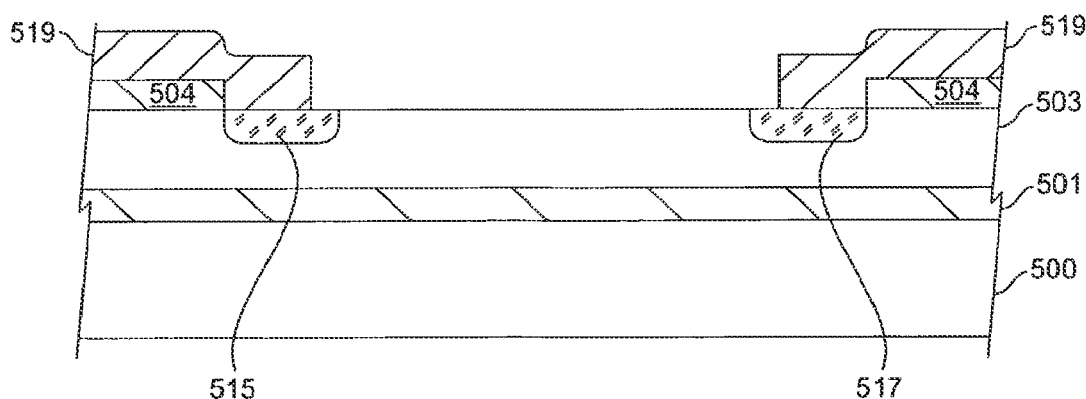

With reference to FIG. 5F, the central portion of the third dielectric layer 519 has been etched to a level coplanar with the surface of the source and drain regions 515, 517. The etched area defines a gate region (discussed below).

Figure 5G:
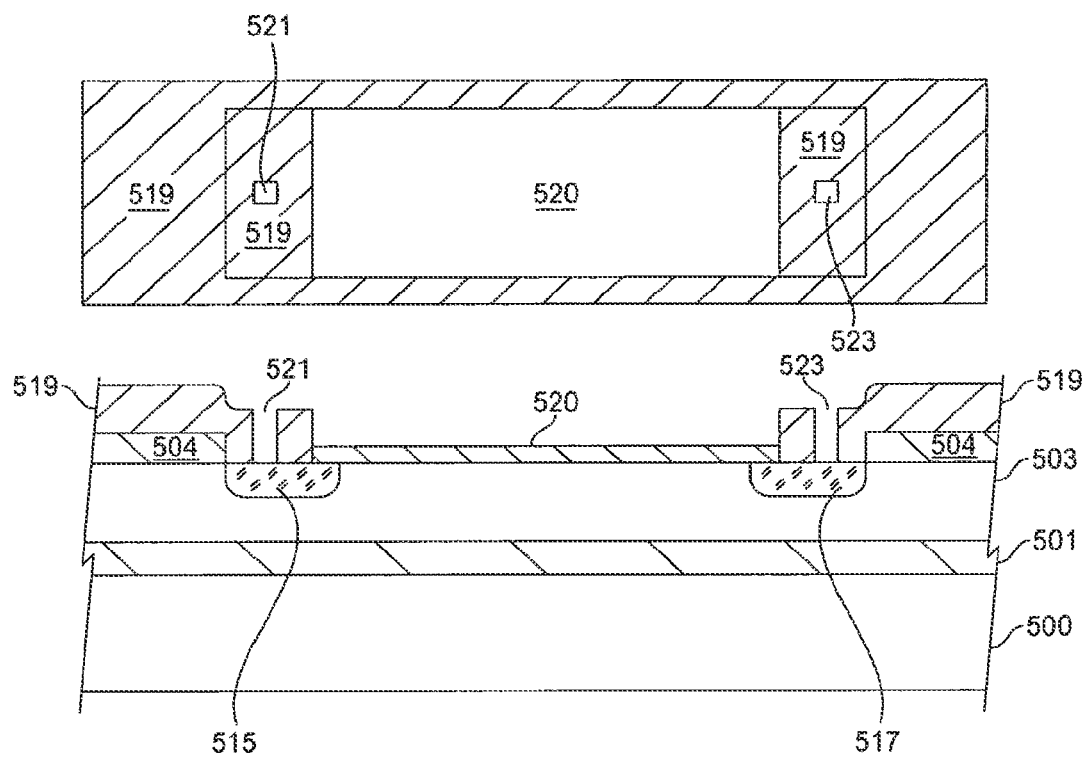

With reference to FIG. 5G, a gate dielectric 520, is formed over the gate region. In an exemplary embodiment, a thin oxide layer is formed by, for example, thermal oxidization. In a subsequent step, contact holes 521, 523, are formed using a photoresist to define the area to be etched, then etching the oxide layer 519 by, for example, hydrofluoric acid. FIG. 5G includes a top view as well.

Figure 5H:
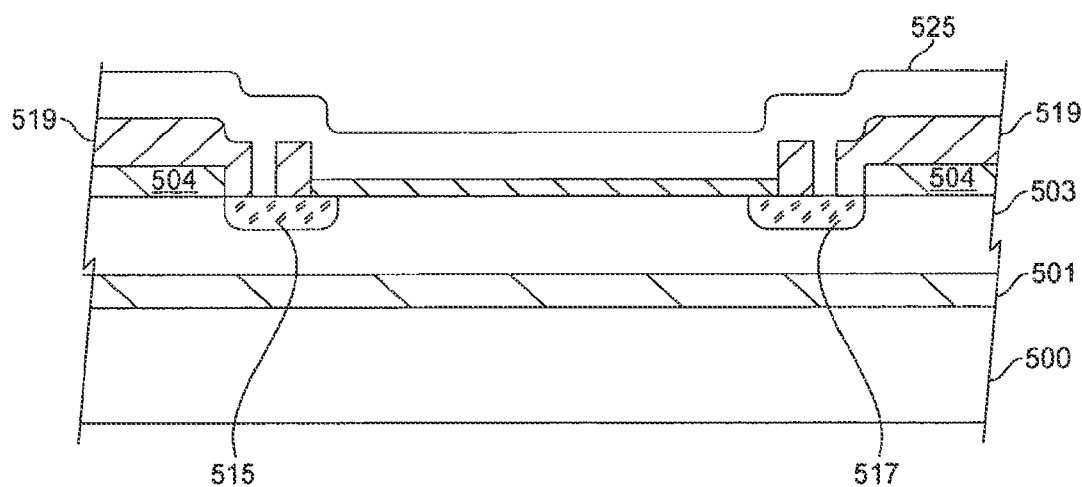

With reference to FIG. 5H, a metallization layer 525, is conformally formed by, for example, ion beam deposition. In a specific embodiment, the metallization layer 525 is aluminum.

Figure 5I:
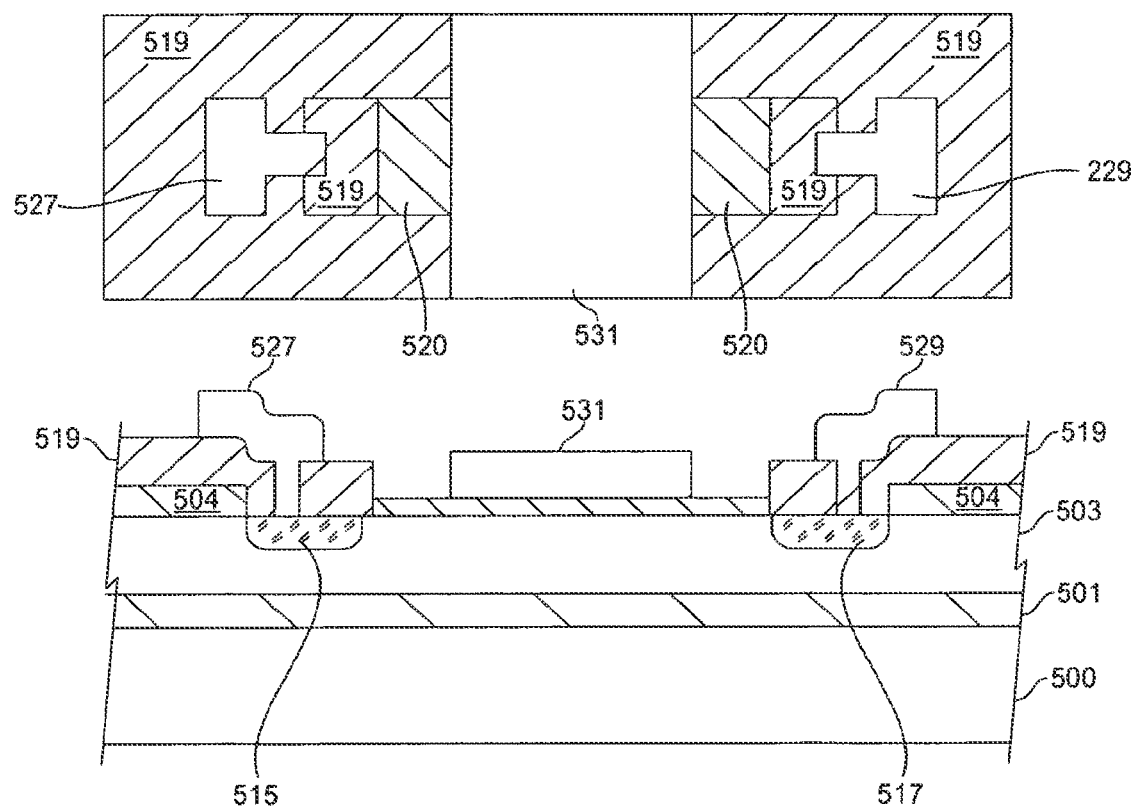

With reference to FIG. 5I, a photoresist layer (not shown) is applied to the metallization layer 525 and is patterned to result in electrical separation of a source contact 527, a drain contact 529, and a gate contact 531. The metallization layer is etched by, for example, ion beam milling. A top view is included.

By fabricating the device with the source and drain aligned with the (100) plane so that source-drain channel current flows along the (100) plane, fabrication induced crystal defects and resultant leakage and parasitic device currents can be reduced.

Another exemplary embodiment utilizing the present invention is a FinFET device with source-drain current that flows along a (100) plane. In a specific embodiment, a silicon substrate with a commercially available epitaxial silicon layer grown on the surface is used. While the (100) plane is referred to throughout, a skilled artisan will recognize many equivalent planes that will result in an advantageous intersect angle with {110}, and {111} planes.

Figure 6A:
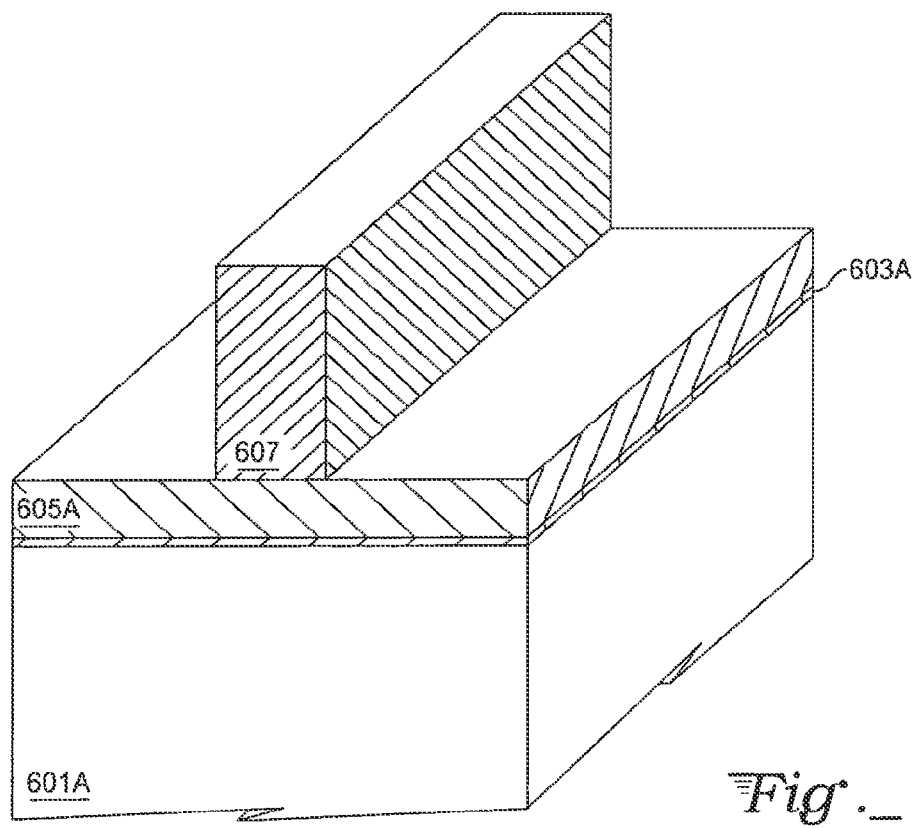

With reference to FIG. 6A, a silicon portion 601A of a silicon-on-insulator (SOI) substrate has a thin silicon dioxide layer 603A, a thicker silicon nitride layer 605A, and a patterned photoresist mask layer 607. In a specific exemplary embodiment, the substrate is a silicon-on-insulator wafer. However, a skilled artisan will recognize that other semiconductor materials may be used instead of an SOI wafer for the substrate. Other semiconductor materials include, for example, elemental semiconductors such as germanium, compound semiconductors such as group III-V, and II-VI materials, and semiconducting alloys (e.g., $Al_xGa_{1-x}As$, $HG_{1-x}CD_xTe$). If elemental semiconductors other than silicon, or compound semiconductors are employed, an atomic layer deposition (ALD) process may be employed for producing thin, high quality oxide layers.

The silicon dioxide layer 603A is a pad oxide to prevent thermally-induced stresses from developing between particular dissimilar materials, such as between silicon and the silicon nitride layer 605A. The silicon dioxide layer 603A may be thermally grown or deposited. The silicon nitride layer 605A is then formed over the silicon dioxide layer 603A by, for example, chemical vapor deposition (CVD). In a specific exemplary embodiment, the silicon dioxide layer 605A is between 50 Å and 200 Å while the silicon nitride layer 605A is between 400 Å and 2000 Å. The patterned photoresist mask layer 607 may be repeated a number of times and disposed laterally over a surface of the substrate 601A to to fabricate multiple surrounded-gate devices. For clarity, only one such device will be shown and described herein.

Figure 6B:
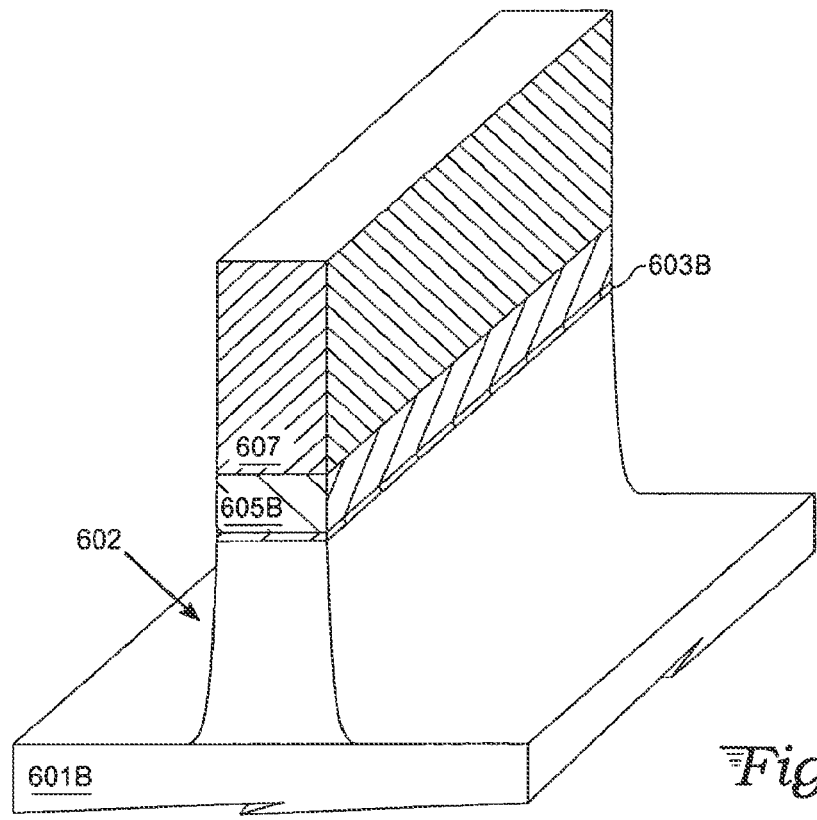

FIG. 6B indicates a fin area 602 being fabricated from the silicon portion of an SOI wafer, exposing an insulating portion 601B. To form the fin area 602, the photoresist mask layer 607 defines an area for which underlying areas will not be etched. These layers (i.e., the silicon nitride layer 605A and silicon dioxide layer 603A) are etched in accordance with methods well-known in the semiconductor arts. For example, depending upon a chemical composition of a given layer, etching may be accomplished through various wet etch (e.g., in hydrofluoric acid, such as contained in a standard buffered oxide etch, or orthophosphoric acid) or dry-etch techniques (e.g., reactive-ion etch (RIE)). Once an etched silicon nitride layer 605B and an etched silicon dioxide layer 603B are formed, the underlying substrate 601A is etched, defining the etched substrate 601B. If the substrate 601A is comprised of silicon, silicon may be wet-etched, for example, with potassium hydroxide (KOH) or tetra-methyl ammonium hydroxide (TMAH). Dry-etch techniques, such as a reactive ion etch (RIE) with a fluorine rich plasma (e.g., $SF_6$) are also known in the art for etching silicon. The fin is aligned along the (100) plane so that source-drain current will flow along the (100) plane.

A sidewall slope of the fin area 602 may be controlled through a choice of the chemistry used in a dry-etch recipe and/or through a choice of the substrate 601A if a monocrystalline semiconductor is used. If a silicon wafer is chosen for the substrate 601A, a dry-etch process may be chosen to etch approximately 90° sidewalls on the fin area 602. Therefore, the fin area 602 can be fabricated in such a way so as to maximize a given surface area to volume ratio of the fin 602 thereby allowing electrical characteristics (e.g., carrier mobility) of the FET device to be modified and tuned.

Figure 6C:
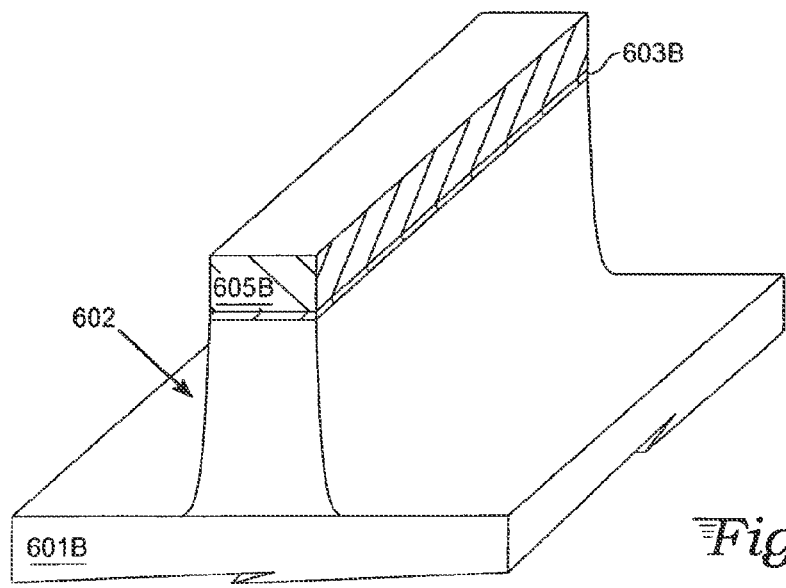
Figure 6D:
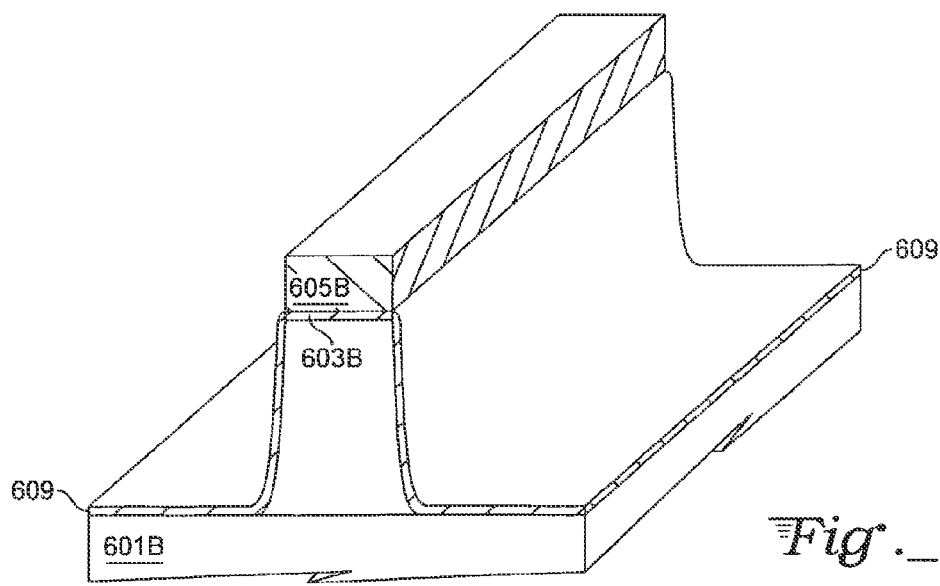

After producing the fin area 602, the photoresist mask layer 607 is removed (FIG. 6C) and a gate oxide layer 609 is thermally grown (FIG. 6D) after an appropriate pre-oxidation clean. In other exemplary embodiments, the gate oxide layer may be conformally deposited by CVD. Thinner layers of gate oxide (e.g., 20 Å to 30 Å) may be deposited by techniques such as atomic layer deposition (ALD).

Figure 6E:
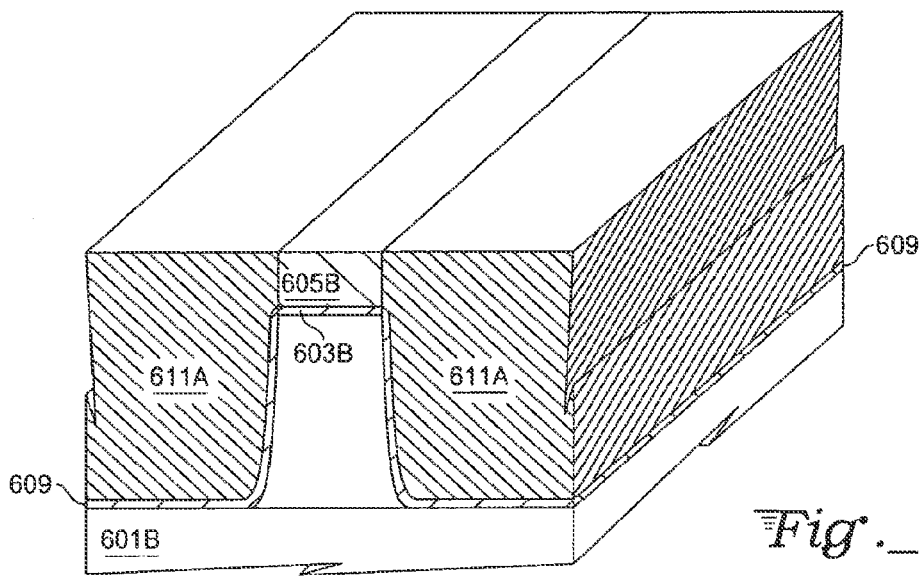

In FIG. 6E, a dielectric fill layer 611A is deposited over the gate oxide layer 609. The dielectric fill process may be similar to shallow-trench isolation (STI) type fills known in the art, for example, a high density plasma (HDP) oxide fill. The dielectric fill layer 611A may be comprised of any insulative material such as silicon dioxide, sapphire, borophosphosilicate glass (BPSG), or any of a number of other materials deposited or otherwise formed over the gate oxide layer 609. The dielectric fill layer 611A may also be comprised of oxynitride or a high-k dielectric material. However, if oxynitride is used for the dielectric fill layer 611A, then an additional masking step will be used to prevent the etched oxynitride layer 605B from being etched away in subsequent process steps. The dielectric fill layer 611A may be brought to a level roughly coplanar with an uppermost part of the etched silicon nitride layer 605B through, for example, chemical mechanical planarization (CMP).

Figure 6F:
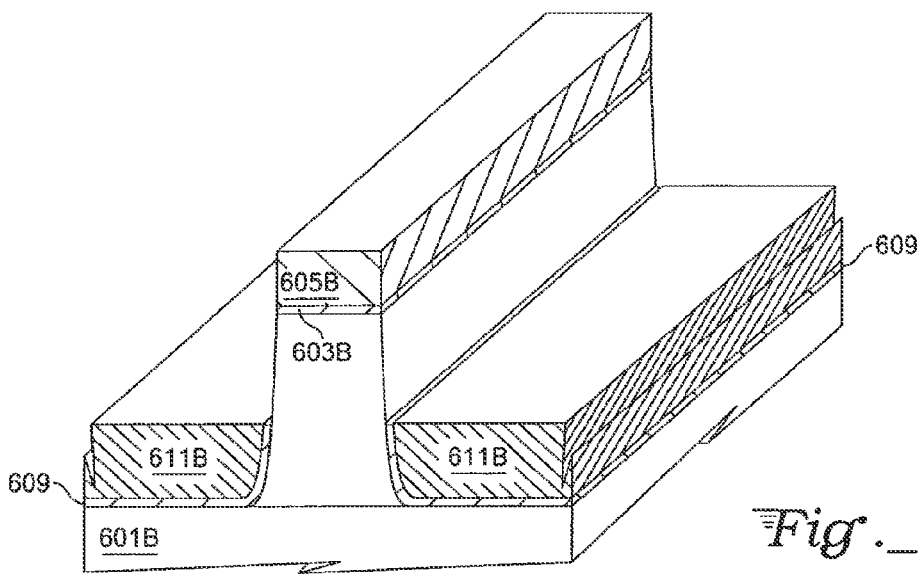

The dielectric fill layer 611A is then etched, producing an etched dielectric fill layer 611B (FIG. 6F). A high-selectivity etchant prevents the etched silicon to nitride layer 605B from being substantially etched away during the dielectric fill layer 611A etch. Further, if the gate oxide layer 609 is comprised of thermally grown silicon dioxide, the gate oxide layer 609 will etch more slowly than an HDP layer used for the dielectric fill layer 611A (i.e., an etch rate of thermal oxide is lower than HDP oxide as HDP is less dense). If an exposed portion of the gate oxide layer 609 (i.e., the portion above the etched dielectric fill layer 611B) is not etched completely, it will be removed prior to a final gate oxidation step described infra.

Figure 6G:
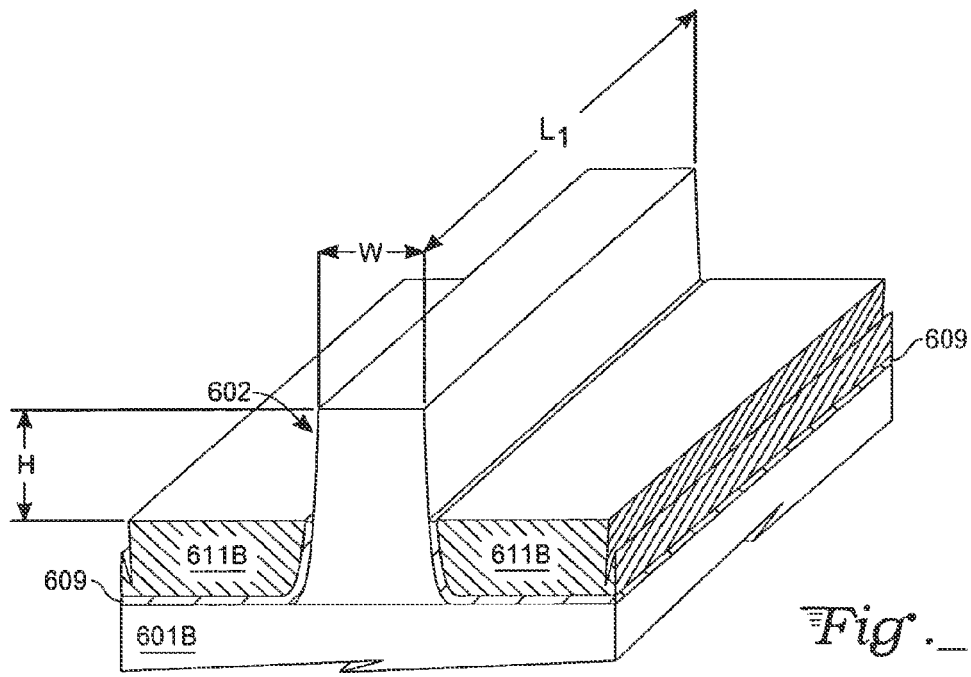

With reference to FIG. 6G, the etched silicon nitride layer 605B, the etched silicon dioxide layer 603B, and exposed portions of the gate oxide layer 609 are substantially etched away using techniques known to a skilled artisan. An exposed section of the fin area 602 defines an active region of the FET device. The active region has a given height, H, length, $L_1$, and width, W. In a specific exemplary embodiment, the active region height, H, is approximately 100 nm to 450 nm. The width of the active region, W, is approximately 100 nm or less and the length, $L_1$, is dependent on a number of factors such as device design rules and gate widths.

Figure 6H:
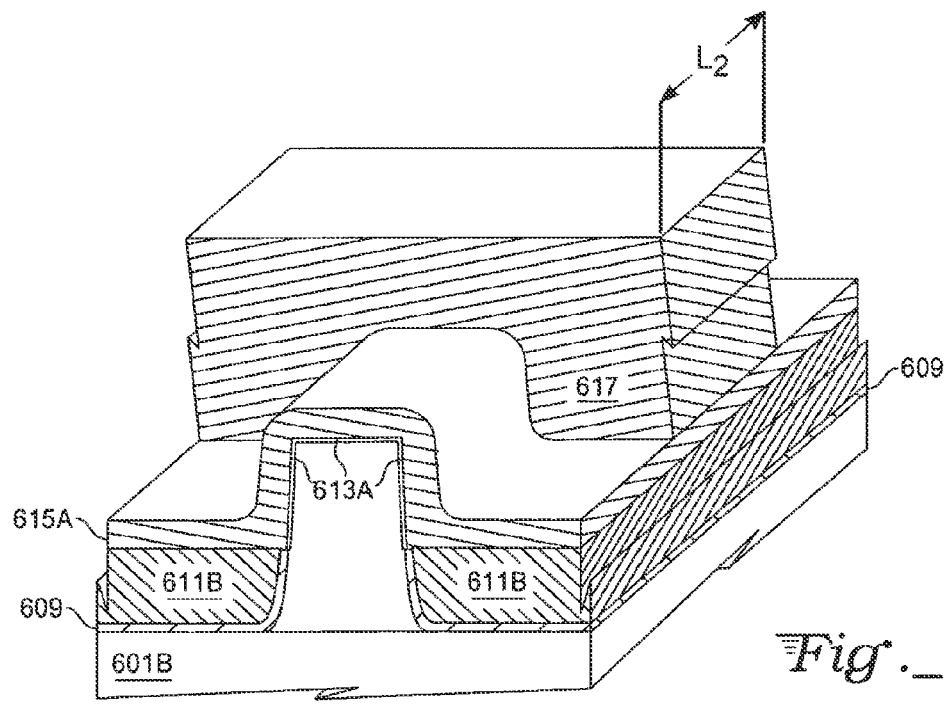
Figure 6I:
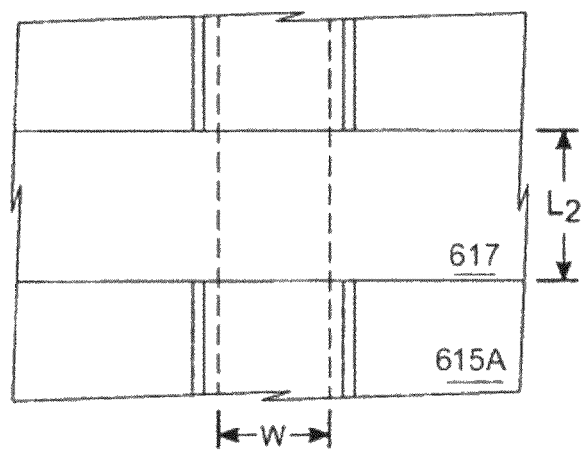

A thermal oxidation, ALD, or high-k oxide deposition process forms a final thin gate oxide 613A (FIG. 6H) over the active region. In a specific exemplary embodiment, the final thin gate oxide is grown or deposited to a thickness of approximately 20 Å to 30 Å. A polysilicon layer 615A is then conformally deposited (FIG. 6H). The polysilicon layer 615A will form a gate region, described infra. A patterned second photoresist layer 617 is formed and patterned to define the gate; the gate having a width commensurate with a length, $L_2$, of the patterned second photoresist layer 617. FIG. 6I is a plan view of the FET device and thus provides clarity in understanding a layout of the device after the second photoresist layer 617 is added. The hidden section is an uppermost portion of the channel active region of FIG. 6G.

Figure 6J:
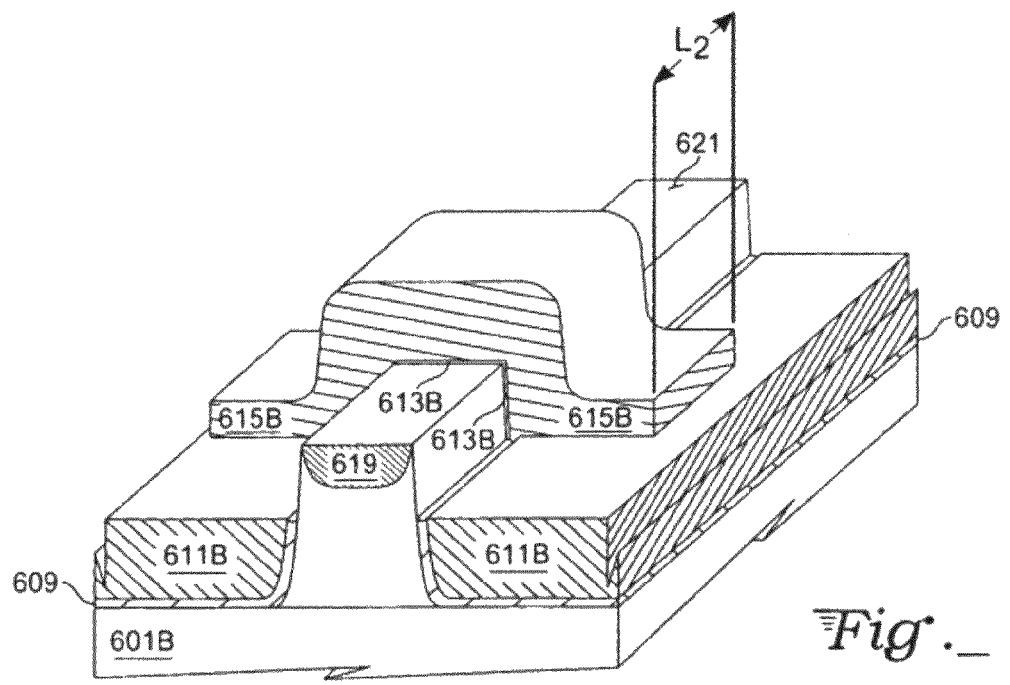

With reference to FIG. 6J, a selective etch process (either wet-etch or dry-etch) is used to fully define a gate region 615B of the device. Generally, a high selectivity to either silicon or silicon dioxide is accomplished using $CHF_3/O_2$, $CH_2F_2$, or $CH_3F$ chemistry. Doped areas are added (e.g., by diffusion or implantation) to define a drain contact region 619 and a source contact region 621 of the device. The patterned second photoresist layer 617 is then removed. FIG. 6K provides a plan view—showing source, gate, and drain contact areas—of a completed FinFET device fabricated according to exemplary embodiments descried herein.

In the foregoing specification, the present invention has been described with reference to specific embodiments thereof. It will, however, be evident to a skilled artisan that various modifications and changes can be made thereto without departing from the broader spirit and scope of the invention as set forth in the appended claims. For example, skilled artisans will appreciate that other types of semiconducting (e.g., any crystalline semiconducting material) and insulating materials other than those listed may be employed. Additional particular process fabrication and deposition techniques, such as low pressure chemical vapor deposition (LPCVD), ultra-high vacuum CVD (UHCVD), and low pressure tetra-ethoxysilane (LPTEOS) may be readily employed for various layers and still be within the scope of the present invention. Although the exemplary embodiments are described in terms of MOS integrated circuit devices, a person of ordinary skill in the art will recognize that other fabrication techniques, such as bipolar or BiCMOS techniques, may readily be employed as well.

While fabrication methods aligning primary device current with the (100) plane is referred to with respect to the exemplary embodiments included herein, a skilled artisan will recognize the use of many equivalent planes that will result in an advantageous intersect angle with {110}, and {111} planes without departing from the scope of the present invention. Additionally, concepts and techniques discussed herein may be added to various electronic devices as a mechanism by which leakage current is reduced. The specification and drawings are, accordingly, to be regarded in an illustrative rather than a restrictive sense.

What is claimed is:

1. An integrated circuit (IC) device, comprising:
   a substrate;
   a fin on an uppermost portion of the substrate, the fin comprising a crystalline semiconducting material extending upwards by a first height from the uppermost portion of the substrate, the fin having a given width and length, the fin further comprising:
   a source region, the source region being doped with a first dopant which supports a first type of majority carrier;
   a drain region, the drain region being doped with a second dopant which supports the first type of majority carrier;
   a channel region, the channel region being interposed between the source region and the drain region, wherein the channel region and the source region and the drain region are aligned alone a line substantially parallel to a {100 } plane of the crystalline semiconducting material of the fin; and
   a gate region, the gate region being formed on at least three sides of the channel region, the gate region being separated from the channel region by a thin dielectric layer, the gate region being doped with a dopant which supports a second type of majority carrier; and an etched dielectric fill layer disposed on both sides of the fin along the length of the fin, the etched dielectric fill layer extending by a second height from the uppermost portion of the substrate, the second height being shorter than the first height, wherein the gate region is formed over the channel region and the etched dielectric fill layer.

2. The IC device of claim 1 wherein the substrate is silicon-on-insulator (SOI).

3. The IC device of claim 1 wherein the substrate is oxygen-implanted silicon (SIMOX).

4. The IC device of claim 1 wherein the crystalline semiconducting material is comprised substantially of silicon.

5. The IC device of claim 1, wherein the difference between the first height and the second height is approximately 100 nm to 450 nm and the width of the fin is approximately 100 nm or less.

6. The IC device of claim 1, wherein the thin dielectric layer is approximately 20 angstroms to 30 angstroms.

7. The IC device of claim 1, wherein the gate region has rounded uppermost edges.

8. An integrated circuit (IC) device, comprising:
   a substrate;
   a fin on an uppermost portion of the substrate, the fin comprising a crystalline semiconducting material extending upwards by a first height from the uppermost portion of the substrate, the fin having a given width and length with rounded uppermost edges, the fin further comprising:
      a source region, a drain region, and a channel region, the channel region being interposed between the source region and the drain region, wherein the channel region and the source region and the drain region are aligned alone a line substantially parallel to a $\{100\}$ plane of the crystalline semiconducting material of the fin; and
      a gate region, the gate region being formed on at least three sides of the channel region, the gate region being separated from the channel region by a thin dielectric layer; and
   an etched dielectric fill layer disposed on both sides of the fin along the length of the fin, the etched dielectric fill layer extending by a second height from the uppermost portion of the substrate, the second height being shorter than the first height, wherein the gate region is formed over the channel region and the etched dielectric fill layer.

9. The integrated circuit (IC) device of claim 8 wherein the substrate is silicon-on-insulator (SOI).

10. The integrated circuit (IC) device of claim 8 wherein the substrate is oxygen-implanted silicon (SIMOX).

11. The IC device of claim 8 wherein the crystalline semiconducting material is comprised substantially of silicon.

12. The IC device of claim 8, wherein the difference between the first height and the second height is approximately 100 nm to 450 nm and the width of the fin is approximately 100 nm or less.

13. The IC device of claim 8, wherein the thin dielectric layer is approximately 20 angstroms to 30 angstroms.

* * * * *

UNITED STATES PATENT AND TRADEMARK OFFICE
CERTIFICATE OF CORRECTION

PATENT NO. : 8,378,414 B2  
APPLICATION NO. : 13/174398  
DATED : February 19, 2013  
INVENTOR(S) : Gayle W. Miller Page 1 of 1

It is certified that error appears in the above-identified patent and that said Letters Patent is hereby corrected as shown below:

In the Specifications

In Column 1 Line 44, Delete "s equivalent" and insert --equivalent--, therefor.

In Column 3 Line 32 (approx.), Delete "s boron" and insert --boron--, therefor.

In Column 4 Line 28, Delete "s substrate" and insert --substrate--, therefor.

In Column 5 Line 1, Delete "is potassium" and insert --potassium--, therefor.

In Column 5 Line 4, Delete "SFO" and insert --$SF_6$)--, therefor.

In Column 5 Line 57, Delete "to approximately" and insert --approximately--, therefor.

In Column 7 Line 12, Delete "to exemplary" and insert --exemplary--, therefor.

In Column 7 Line 44, Delete "to semiconductor" and insert --semiconductor--, therefor.

In Column 8 Line 38, Delete "to fabricate" and insert --fabricate--, therefor.

In Column 9 Line 33, Delete "to nitride" and insert --nitride--, therefor.

In the Claims

In Column 10 Line 60, In Claim 1, Delete "alone" and insert --along--, therefor.

In Column 12 Line 3, In Claim 8, Delete "alone" and insert --along--, therefor.

Signed and Sealed this  
Seventeenth Day of December, 2013

Margaret A. Focarino  
*Commissioner for Patents of the United States Patent and Trademark Office*